United States Patent [19]
Feilchenfeld et al.

[11] Patent Number: 6,150,726
[45] Date of Patent: Nov. 21, 2000

[54] COMPONENT CARRIER WITH RAISED BONDING SITES

[75] Inventors: Natalie Barbara Feilchenfeld; Stephen Joseph Fuerniss, both of Endicott; Michael Anthony Gaynes, Vestal; Mark Vincent Pierson, Binghamton, all of N.Y.; Pat Hoontrakul, Sommerville, N.J.

[73] Assignee: International Business Machines Corp., Armonk, N.Y.

[21] Appl. No.: 09/088,834

[22] Filed: Jun. 2, 1998

Related U.S. Application Data

[62] Division of application No. 08/709,375, Sep. 6, 1996, Pat. No. 5,759,737.

[51] Int. Cl.[7] ............................. H05K 1/11; H01L 23/48; H01L 29/62; H01L 29/40; H01L 23/52
[52] U.S. Cl. .................. 257/784; 257/786; 257/700; 257/758; 257/668; 257/701; 257/778
[58] Field of Search ........................ 257/778, 668, 257/701, 700, 758, 696, 693, 737, 738, 734, 777, 779

[56] References Cited

U.S. PATENT DOCUMENTS

| | | | |
|---|---|---|---|
| 4,710,798 | 12/1987 | Marcantonio | 257/777 |
| 5,281,151 | 1/1994 | Arima et al. | 439/68 |
| 5,360,988 | 11/1994 | Uda et al. | 357/529 |
| 5,367,403 | 11/1994 | Yamamoto et al. | 359/494 |
| 5,367,435 | 11/1994 | Andros et al. | 361/749 |
| 5,375,042 | 12/1994 | Arima et al. | 257/686 |
| 5,378,926 | 1/1995 | Chi et al. | 257/779 |
| 5,381,039 | 1/1995 | Morrison | 257/701 |
| 5,399,898 | 3/1995 | Rostoker | 257/499 |
| 5,400,220 | 3/1995 | Swamy | 361/760 |
| 5,434,452 | 7/1995 | Higgins, III | 257/773 |
| 5,436,203 | 7/1995 | Lin | 29/841 |
| 5,450,283 | 9/1995 | Lin et al. | 361/704 |
| 5,523,622 | 6/1996 | Harada et al. | 257/734 |
| 5,635,767 | 6/1997 | Wenzel et al. | 257/778 |
| 5,640,051 | 6/1997 | Tomura et al. | 257/778 |
| 5,652,466 | 7/1997 | Hirakawa et al. | 257/772 |
| 5,654,590 | 8/1997 | Kuramochi | 257/778 |
| 5,661,341 | 8/1997 | Neftin | 257/698 |
| 5,672,911 | 9/1997 | Patil et al. | 257/691 |
| 5,710,071 | 1/1998 | Beddingfield et al. | 438/108 |
| 5,734,560 | 3/1998 | Kamperman et al. | 257/738 |
| 5,763,939 | 6/1998 | Yamashita | 257/668 |
| 5,773,882 | 6/1998 | Iwasaki | 257/692 |
| 5,777,383 | 7/1998 | Stager et al. | 257/700 |
| 5,786,630 | 7/1998 | Bhansali et al. | 257/697 |

*Primary Examiner*—Alexander Oscar Williams
*Attorney, Agent, or Firm*—John R. Pivnichny

[57] ABSTRACT

Chip carrier packages, integrated circuits, wiring boards, and assemblies in computer systems are made having conductive adhesive interconnections. Electrically conductive polymer paste with metal particles and powders are used with photoimagable polymer films to form the interconnection structure. These articles are produced with screening and printing processes using a screening head and printing machine.

6 Claims, 42 Drawing Sheets

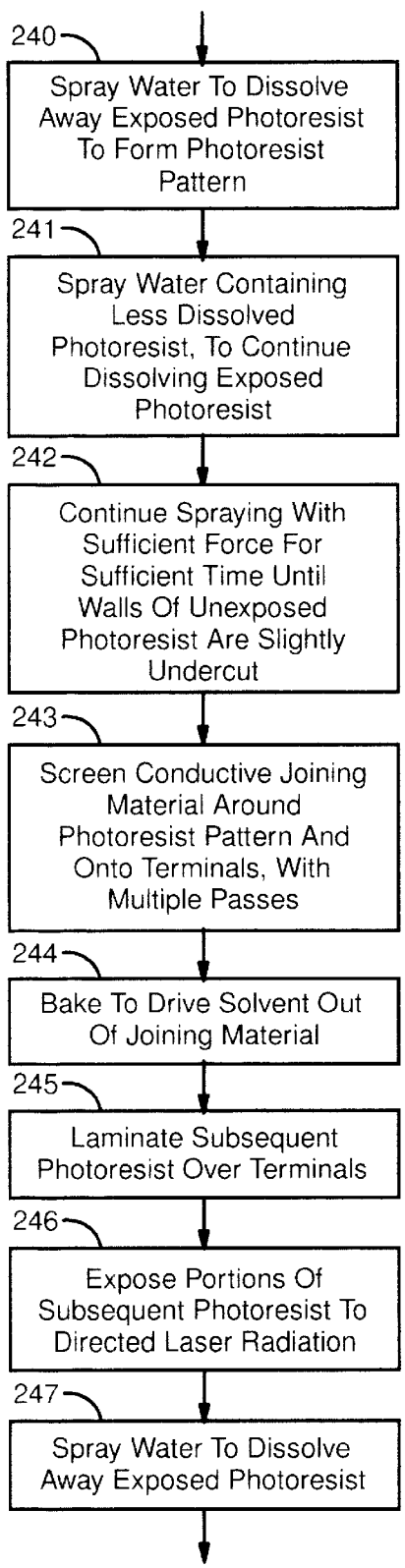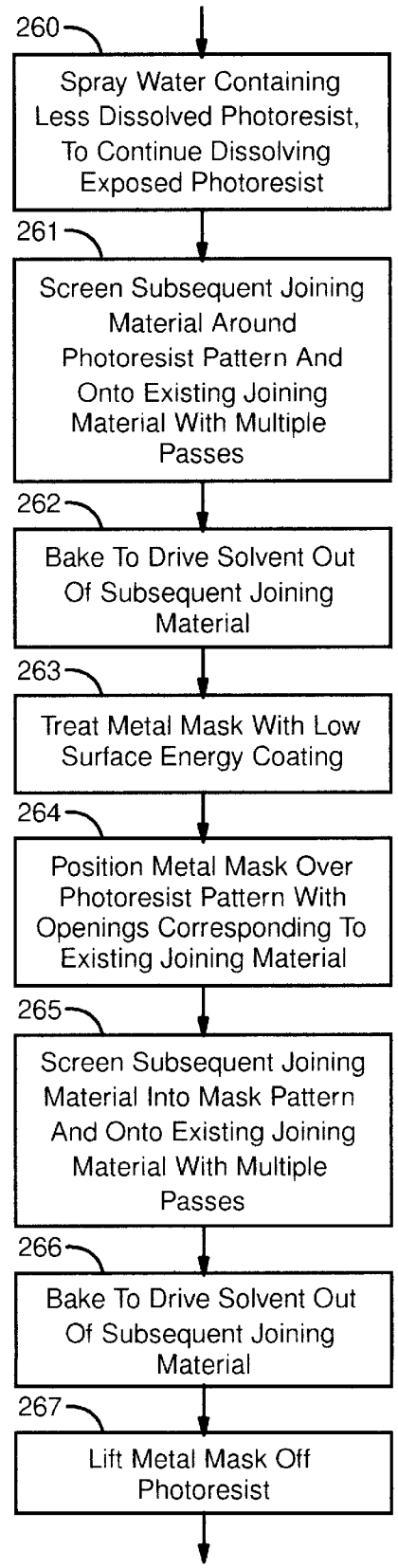
FIG. 4c
FIG. 4d

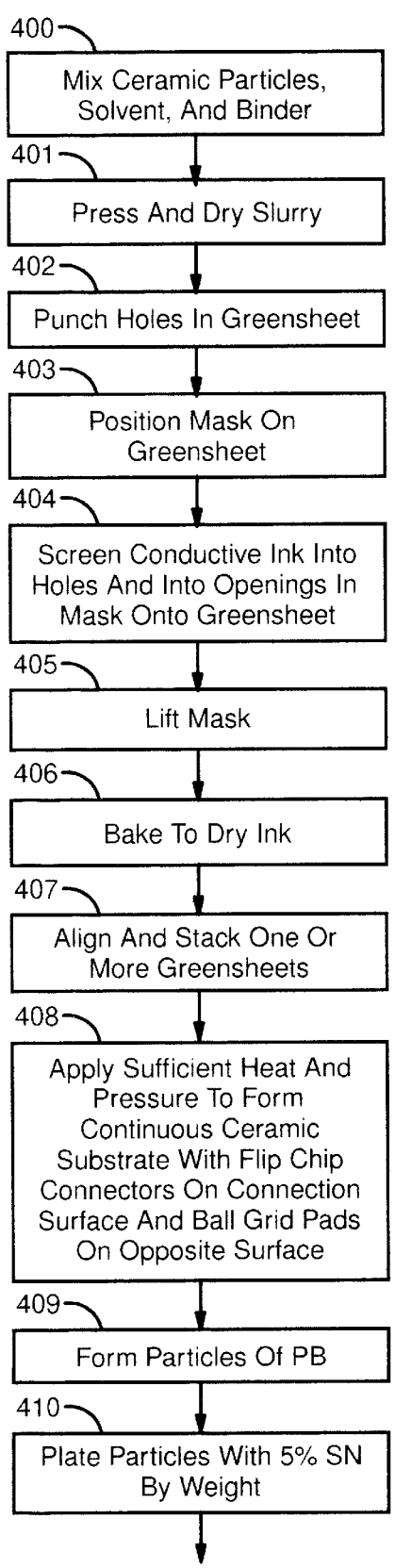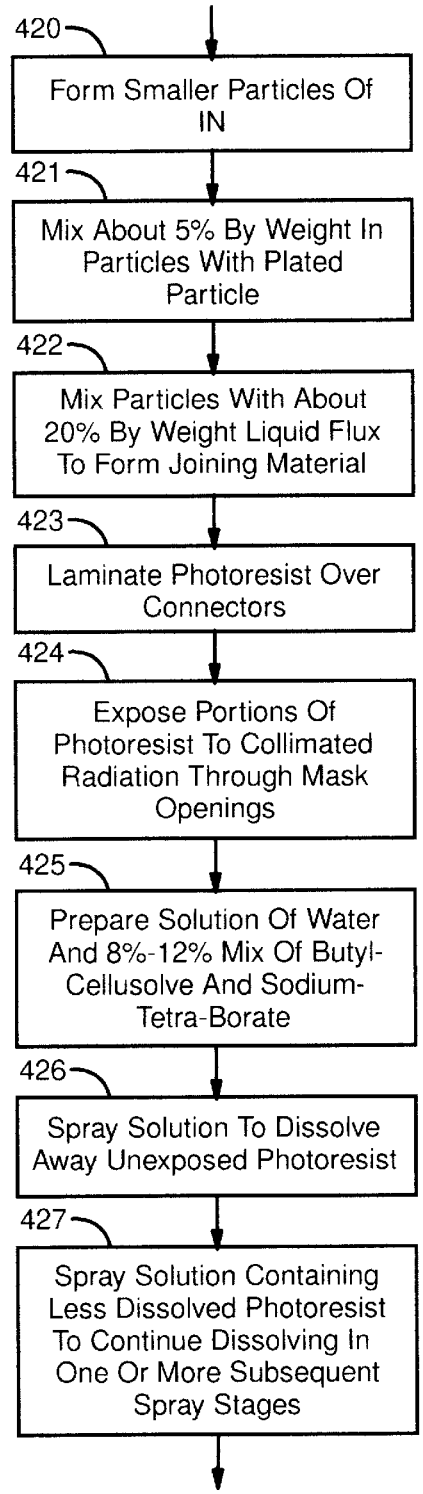
FIG. 10a
FIG. 10b

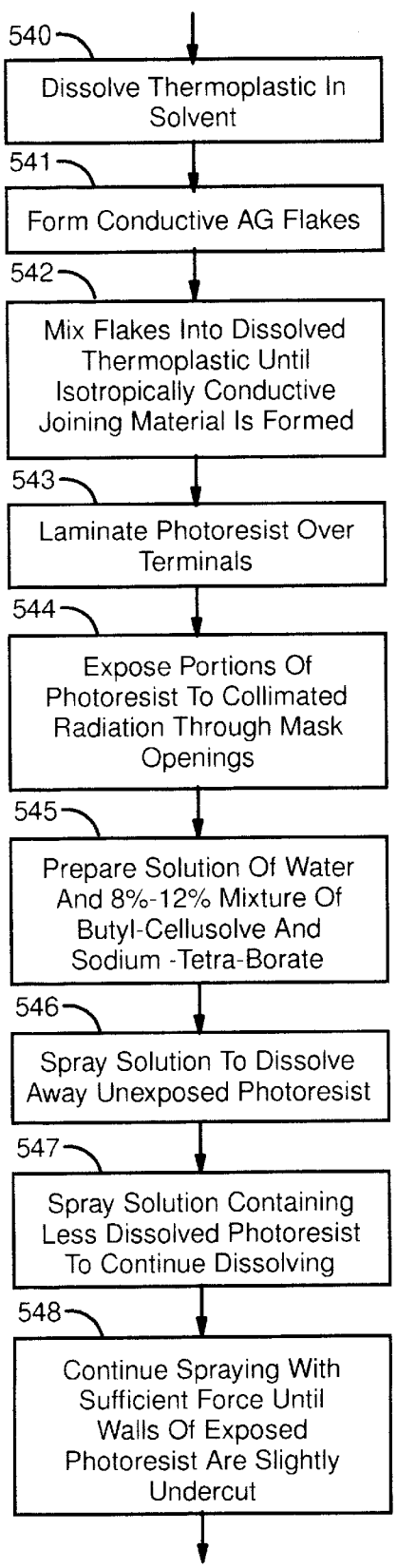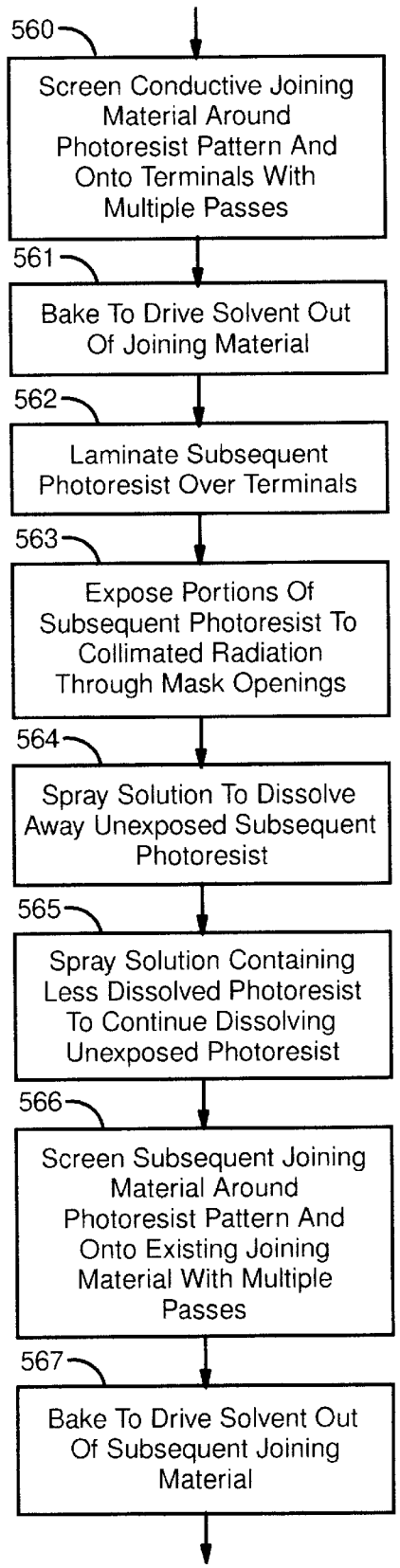
FIG. 13c
FIG. 13d

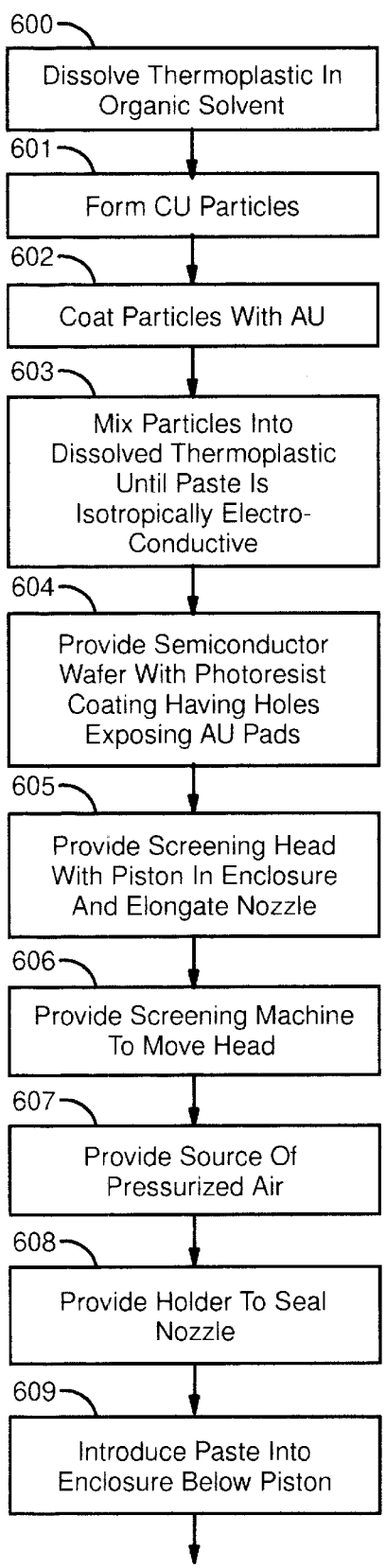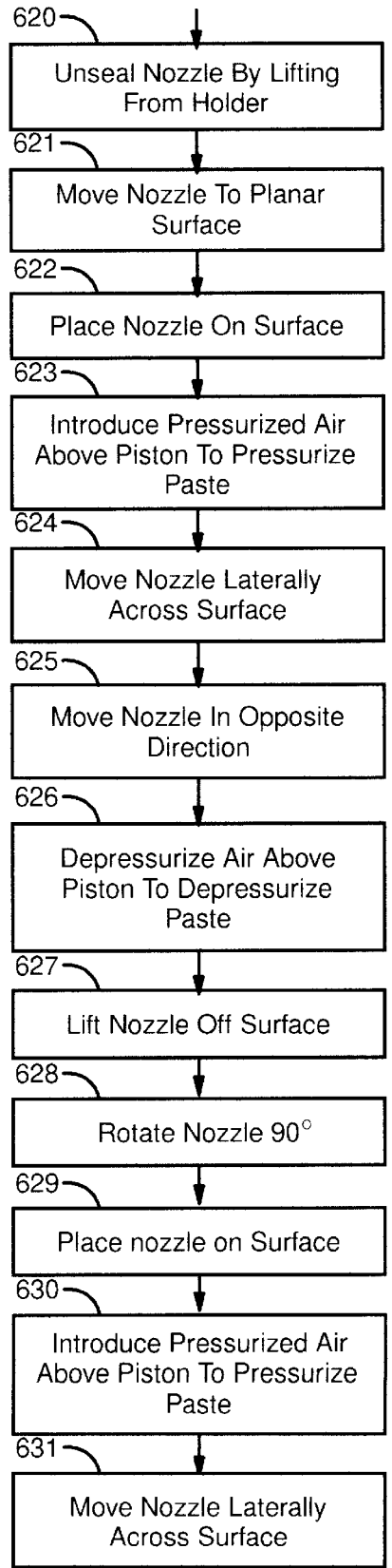
FIG. 17a
FIG. 17b

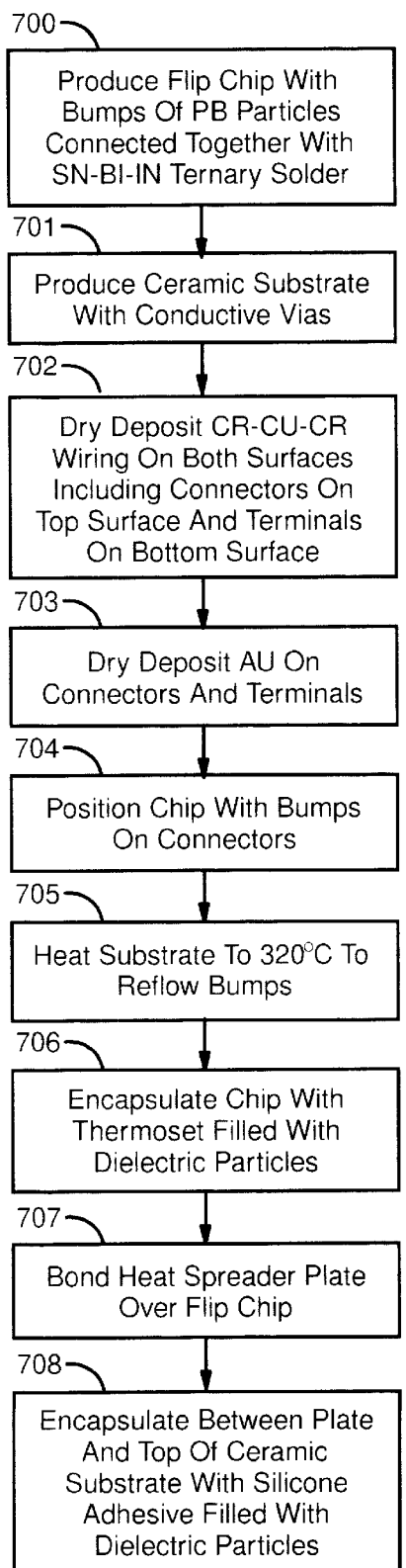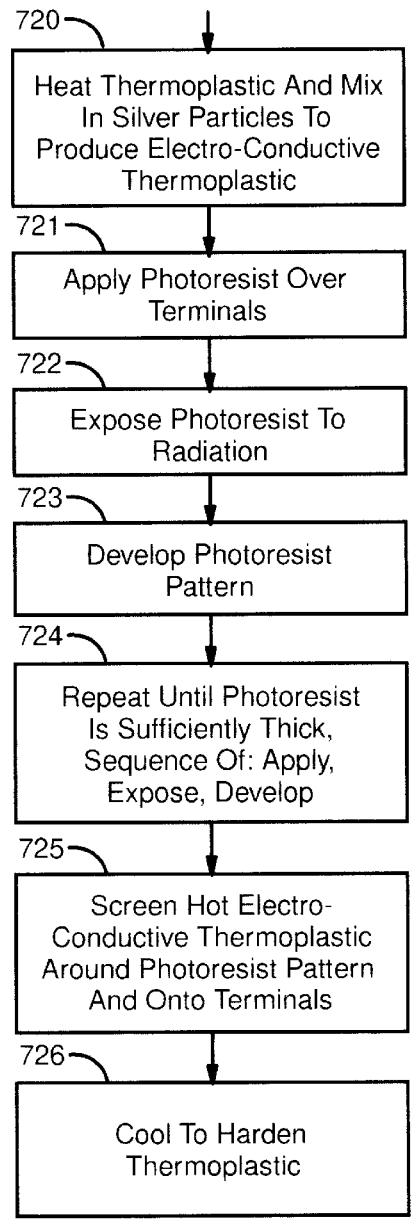
FIG. 21a
FIG. 21b

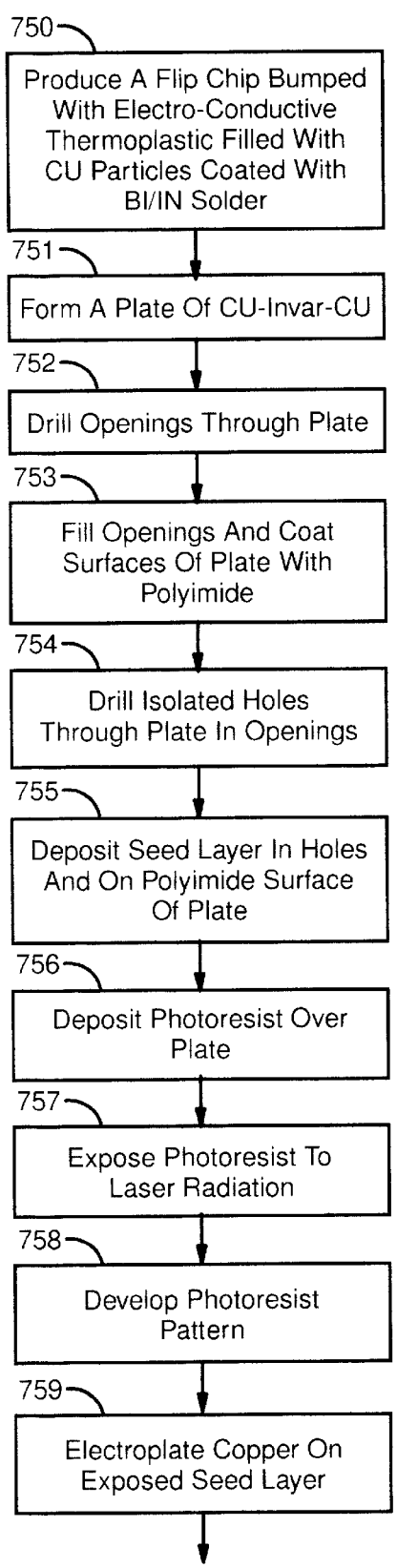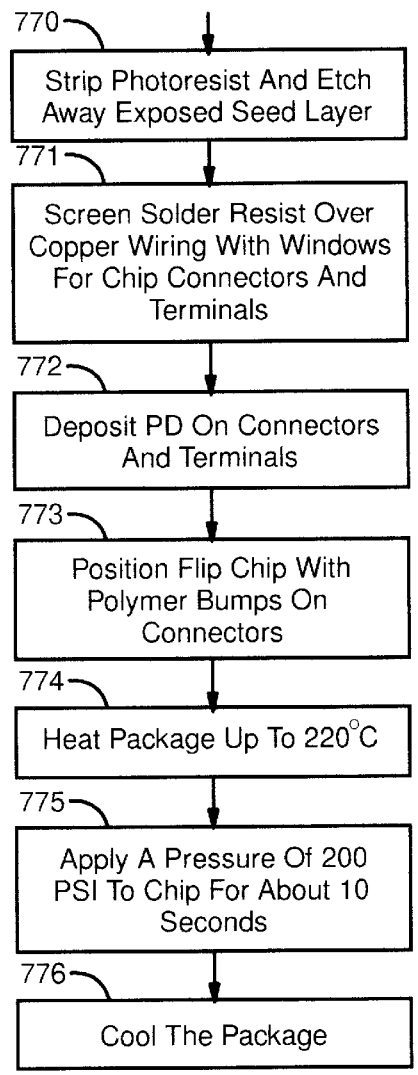
FIG. 24a
FIG. 24b

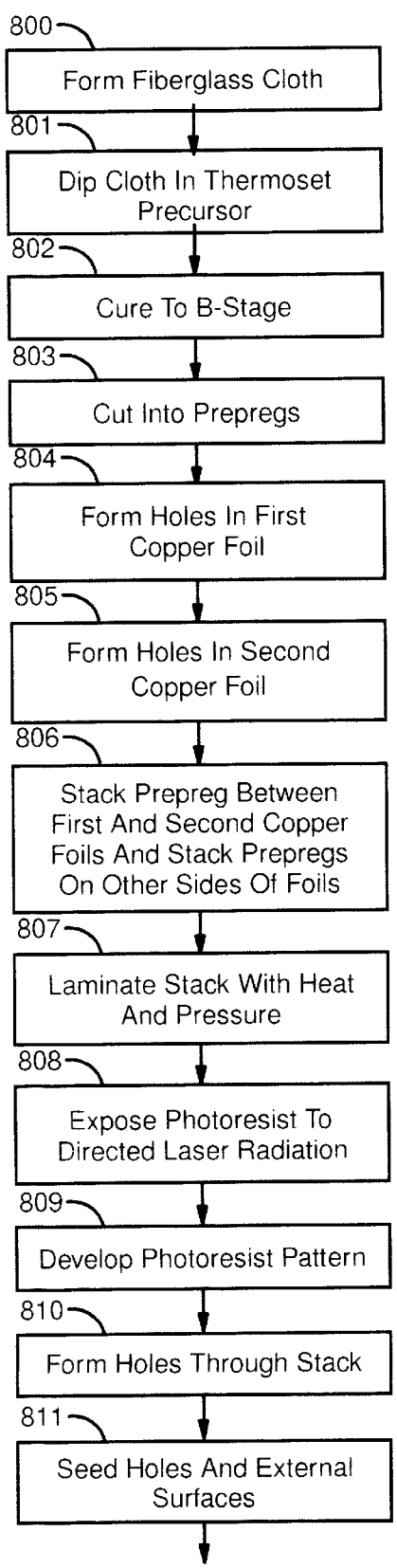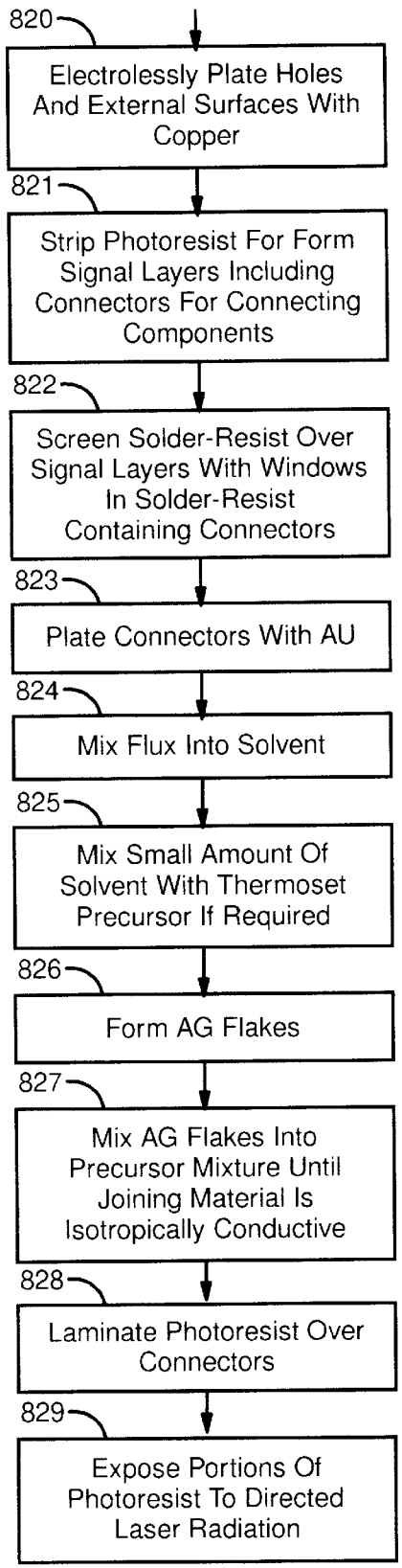
FIG. 27a
FIG. 27b

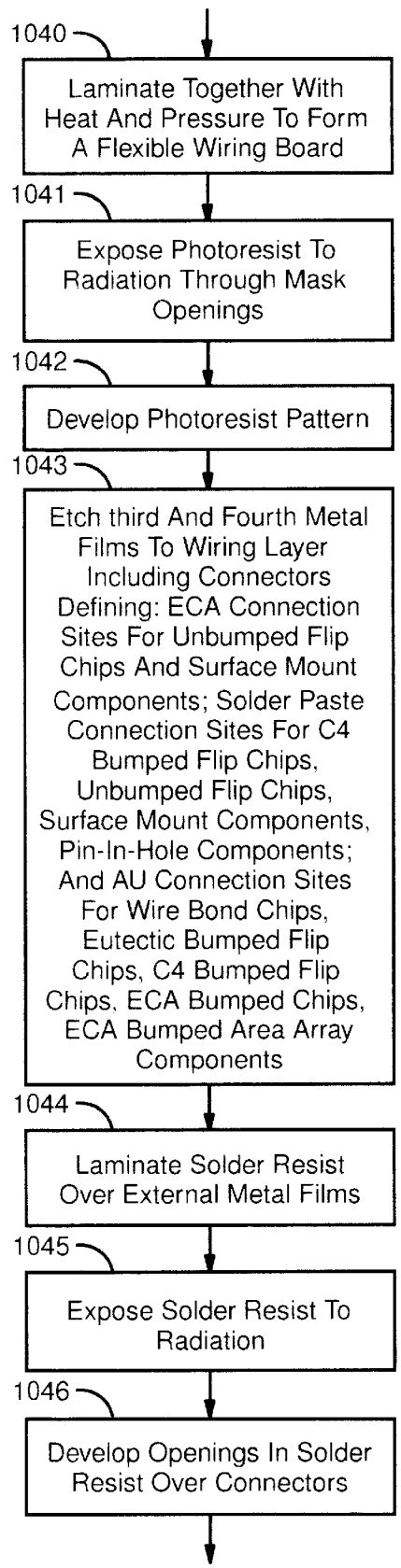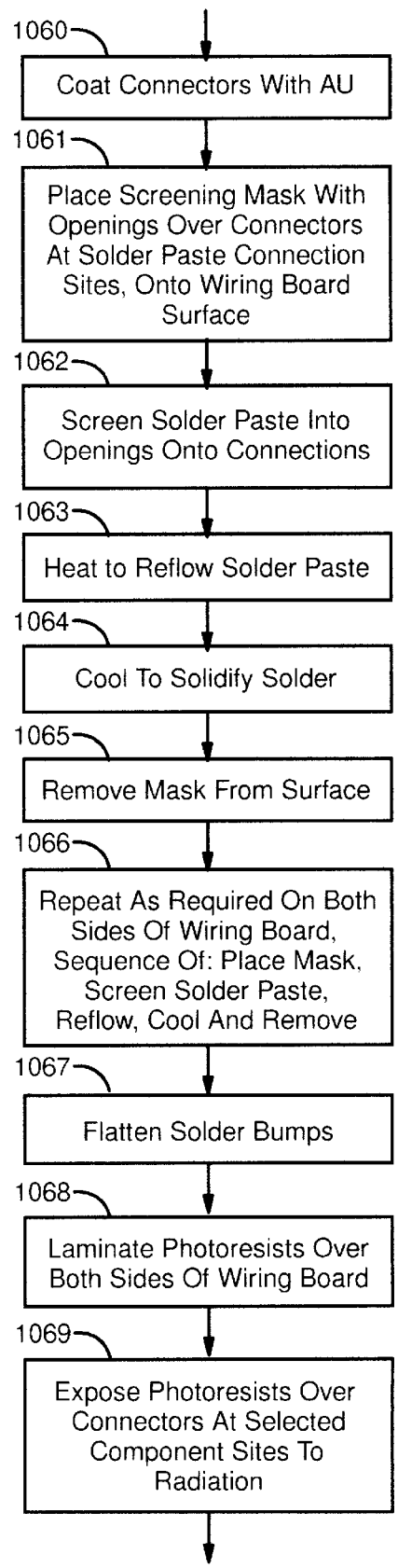
FIG. 33c
FIG. 33d

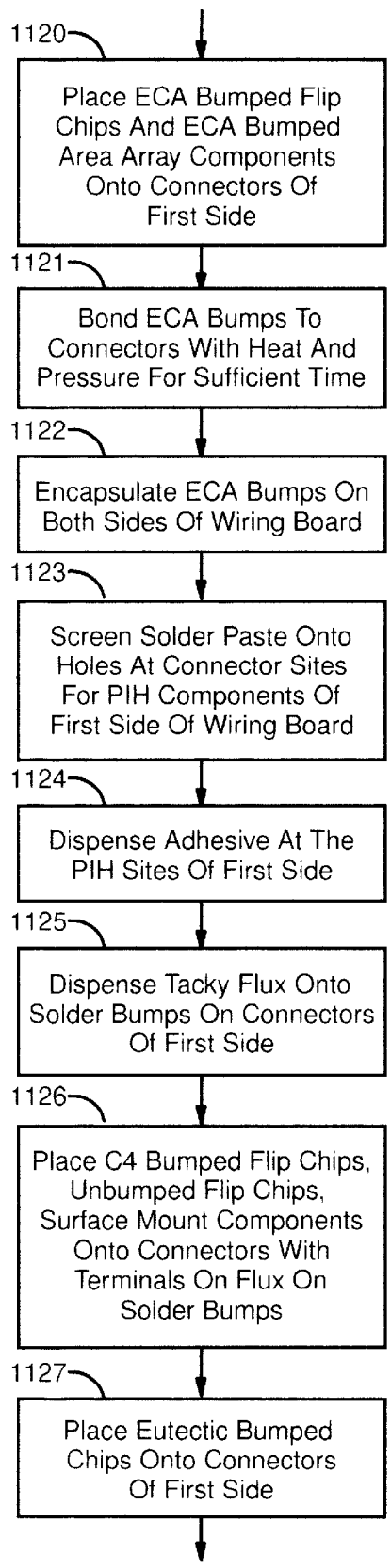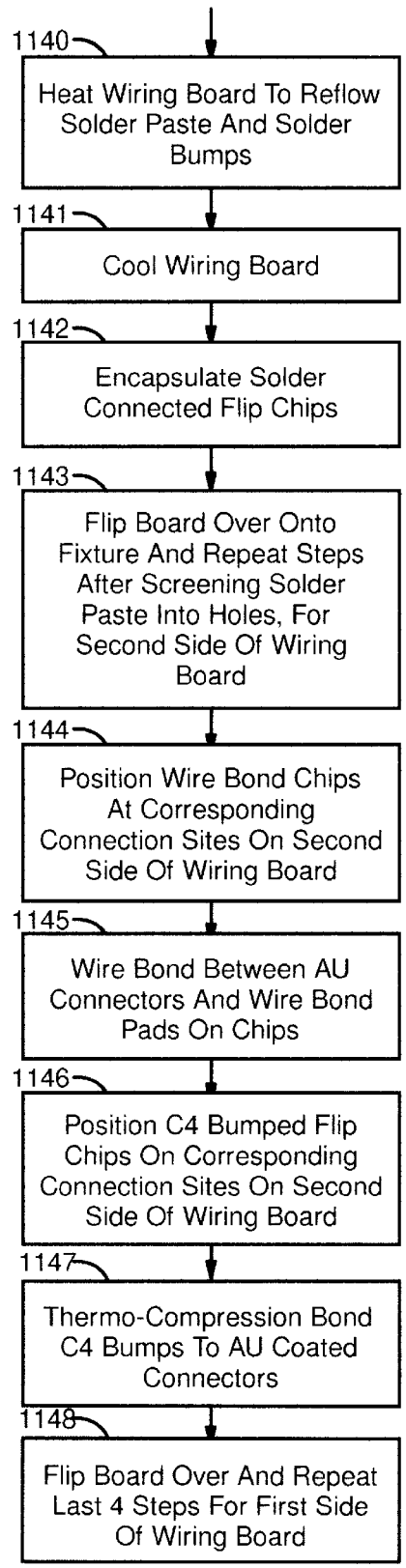
FIG. 33g
FIG. 33h

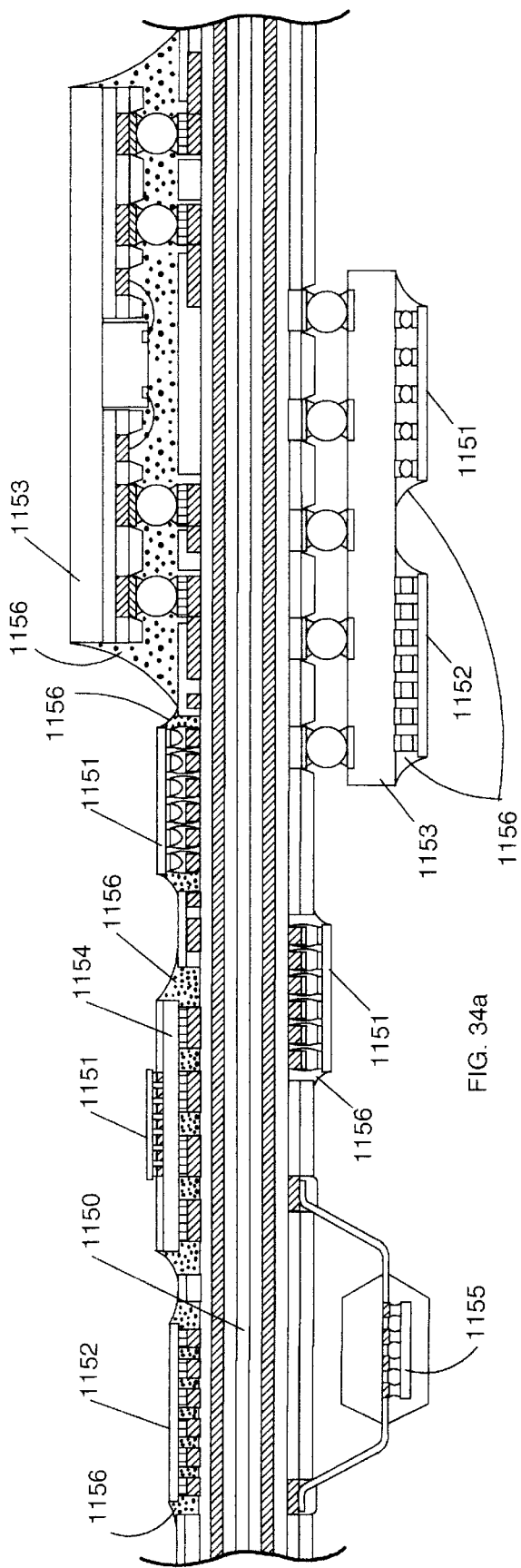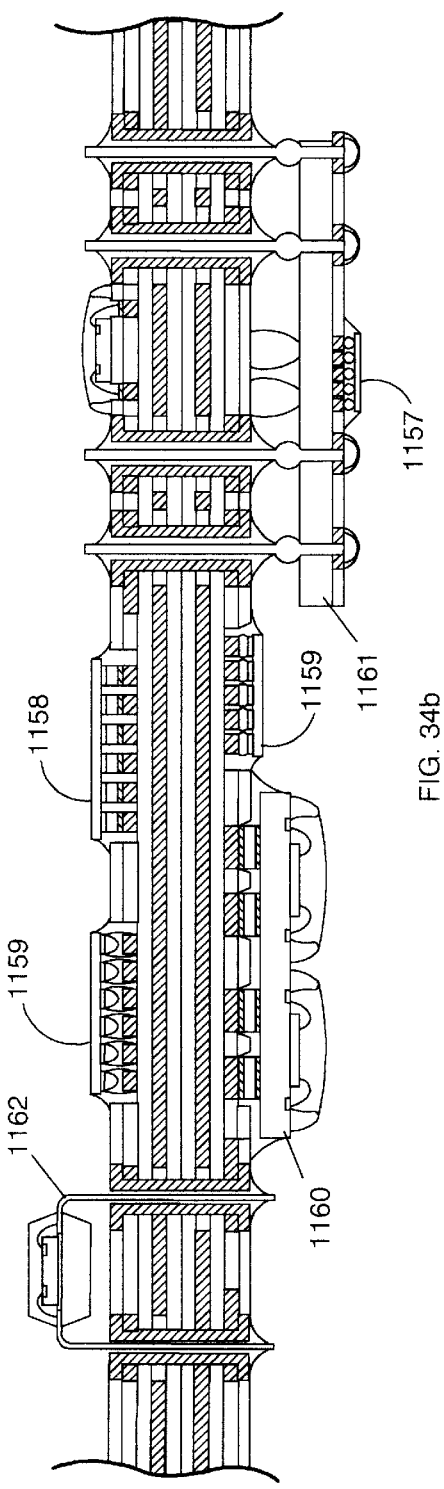
FIG. 34a
FIG. 34b

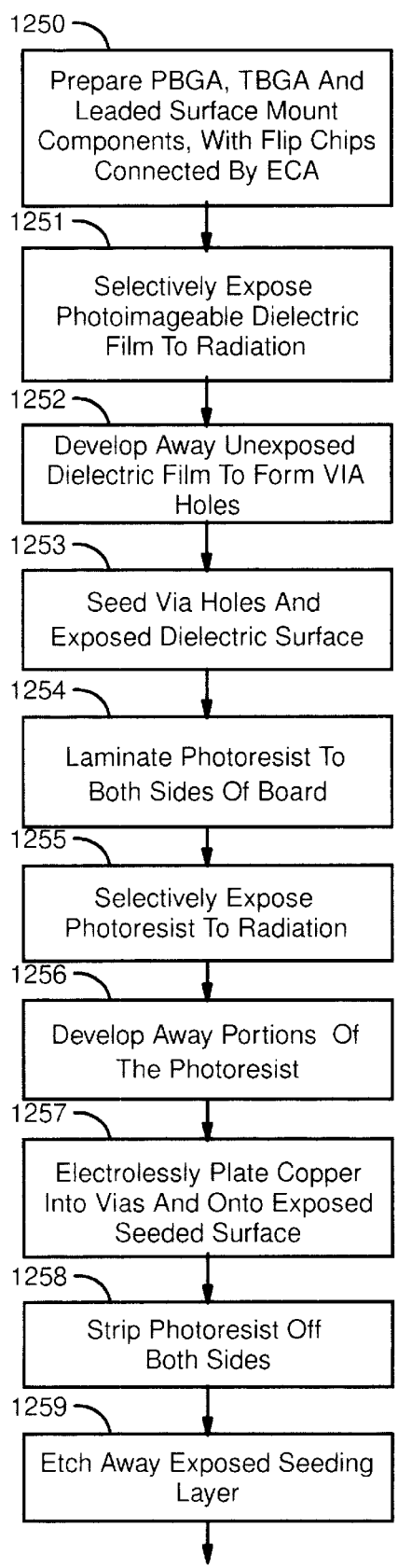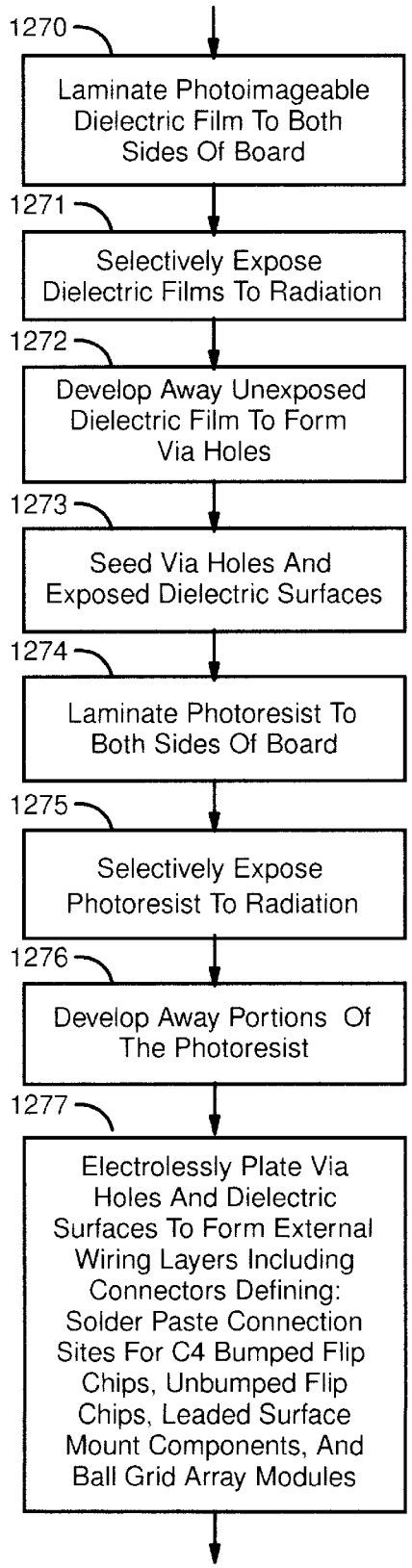
FIG. 36a
FIG. 36b

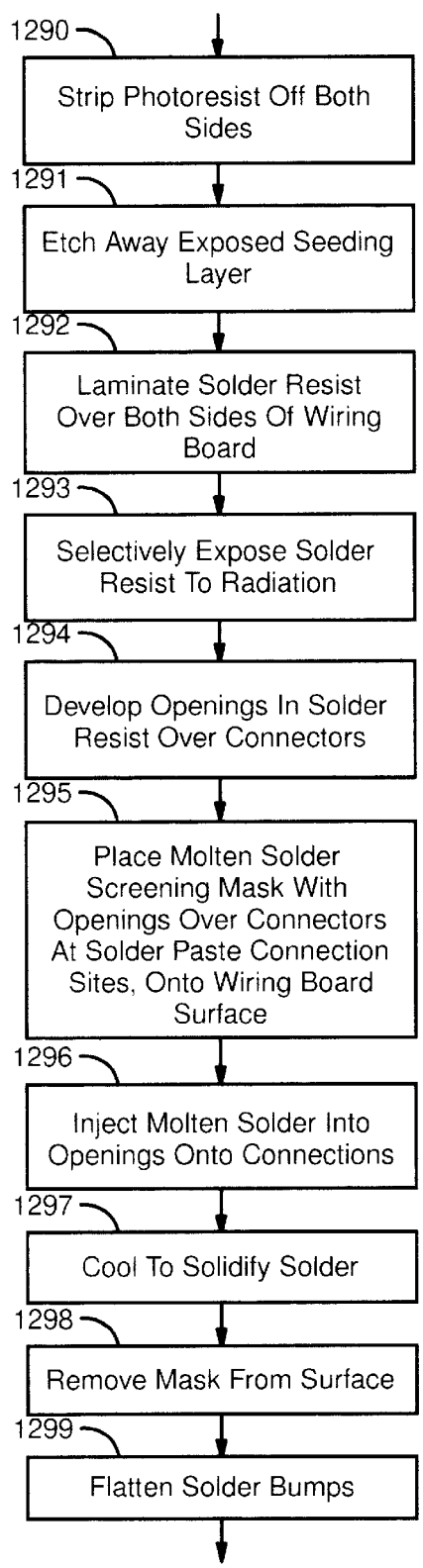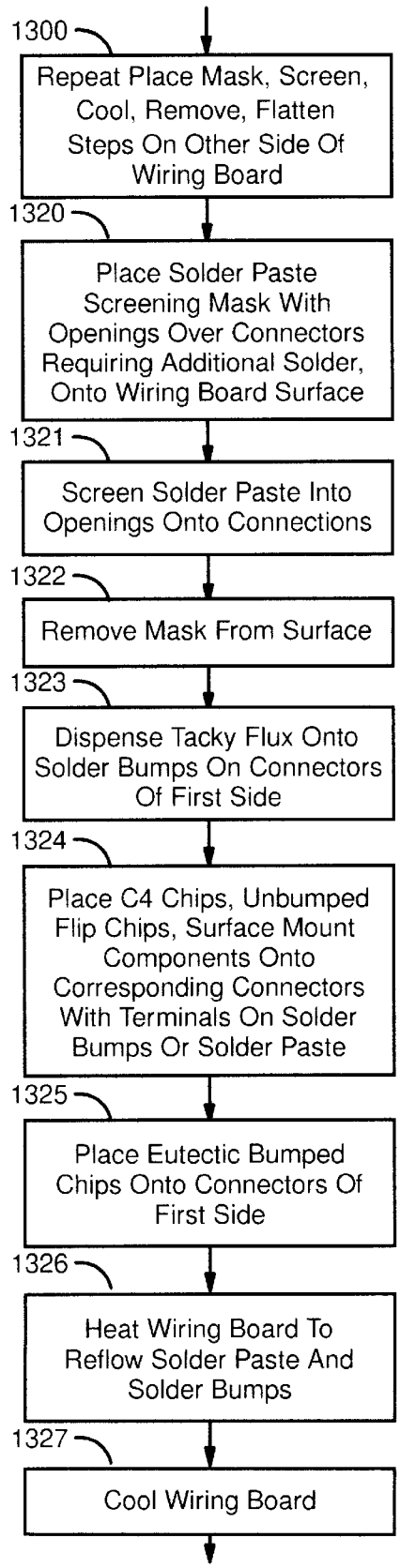
FIG. 36c
FIG. 36d

COMPONENT CARRIER WITH RAISED BONDING SITES

This is a Division of Ser. No. 08/709,375 filed on Sep. 6, 1996, now U.S. Pat. No. 5,759,737.

FIELD OF THE INVENTION

These inventions are related to production of computer systems, production of computer wafers and chips (i.e. integrated circuits (ICs)), production of chip carriers, production and use of electrically conductive polymer paste, manufacture and use of solder pastes, screen printing of paste onto substrates, production and use of metal particles and powders for such pastes, photolithographic patterning of photoimagable polymer films, production of wiring boards. More specifically these inventions are most closely related to using electro-conductive polymers for interconnecting between terminals of flip chips and corresponding connectors of chip carriers to form IC packages and for interconnection between surface mount terminals of electronic components and corresponding contacts of wiring substrates to form circuit board assemblies.

BACKGROUND

In the arts of producing electronic components and attaching the components to circuit cards, terminal on the components are normally attached to connectors on circuit cards using joints of solder. The most common method of applying solder is to form holes through the circuit board, plate copper into the holes, position components on top of the board with pin terminals extending through the holes, and dip the bottom of the board in a bath of molten solder.

More recently surface mount components have been developed which are attached to pads on circuit boards by screen printing a paste of solvent and solder particles onto the pads and then placing the terminals of components on the pads and then moving the board through an oven to heat the paste enough to melt the solder and form a solder joint. The solder commonly used in the electronics industry is an alloy of tin and lead which has lead to environmental concerns. In addition the high processing temperature required to melt the solder paste limits the materials that can be used in electronics.

Those skilled in the art are directed to the following citations. U.S. Pat. No. 5,376,403 to Capote, Todd, Manesis, and Craig, and a paper entitled *Multilayer Printed Circuits From Revolutionary Transient Liquid Phase Inks* by Capote, Todd, Gandhi, Carr, Walters, and Viajar, presented at *Nepcon West '93*, Feb. 11, 1993, suggest mixing a high melting point (up) powder, a low mp solder powder, a fluxing agent, a resin and a reactive monomer or polymer to form a polymer thick film ink. Also, the high mp powder may be coated with solder to prevent oxidation, and a third powder such as Ni powder thinly coated with Au may be added to provide transient liquid phase (TLP) bonding. Using ORMET™ 1200 by Toranaga Technologies, Inc. in Technical Note #9 Rev. 2 Jan. 12, 1994. Using ORMET™ 2005 by Toranaga Technologies, Inc. in *Technical Note #3 Rev.* 6 Jan. 30, 1994. *Solders and Soldering* by H. H. Manko (McGraw Hill, 1979) lists various solders and their properties. U.S. Pat. No. 5,129,962 to Gutierrez describes no-clean fluxing agents for flip chip attachment. U.S. Pat. No. 5,268,536 to Kakehi suggests attaching leads to pads using conductive adhesive.

Polymers made electroconductive by filling with electroconductive particles is suggested by U.S. Pat. Nos. 5,410,806 to Schneider; 5,395,876 to Frentzel; 5,286,417 to Mahmoud; 5,136,365 to Pennisi; 4,780,371 and 4,859,268 to Joseph. U.S. Pat. No. 5,463,190 to Carson suggests polymers filled with powders of two different elements in eutectic proportions. Transient Liquid Phase bonding is suggested by U.S. Pat. Nos. 5,432,998 to Galasco; 5,346,857 to Scharr; 5,269,453 to Melton; 4,147,669 and 4,233,103 to Shaheen; 3,523,358 to Zimmer; and by the citations *Development of Transient Liquid Phase Soldering Process for LSI Die-Bonding* by Izuta, Abe, Hirota, Hayashi and Hoshinouchi of Mitsubishi Electric, in 1993 IEEE Proceedings of Elect. Comp, & Tech. conf. P. 1012–1016; *Transient Liquid Phase Bonding Process* by Kang et al in IBM TDB Vol. 32, No. 4A, September 1989. *Semiconductor Joining by the Solid-Liquid-Interdiffusion (SLID) Process* by Leonard Bernstein in *Journal of the Electrochemical Society* Vol. 113, No. 12, pp 1282–1288 December 1966. U.S. Pat. No. 5,242,099 to Ueda suggests making metal bonds between a surface with a thin diffusing layer and another surface with a target layer. Coating of metal particles is suggested in U.S. Pat. No. 4,902,857 to Cranston.

U.S. Pat. No. 5,024,372 to Altman discloses use of photoresists for screening solder paste. U.S. Pat. No. 5,436,503 discloses conductive adhesives for chip connection. European Application EP307766 A1 discusses screening paste into a layer on a circuit board. European Patent Application EP0697727 A2 discloses screening solder paste into a lift off mask. U.S. Pat. No. 5,074,947 to Estes discloses conductive polymer bumps on a flip chip with two layers. U.S. Pat. No. 5,314,709 to Doany discloses an evaporatable dielectric. U.S. Pat. No. 5,001,829 to Schelhorn discloses a removable stencil for solder paste. All the above citations are hereby-incorporated herein by reference.

SUMMARY OF THE INVENTION

In the invention a computer system is produced by screening joining material into patterns formed in photoresist. Electrically conductive polymers interconnect computer flip chips to carriers. In another aspect of the invention electrically conductive adhesives interconnect components into circuit board assemblies. The invention includes wafers and flip chips produced by screening joining materials into patterns of openings in photoresists and also include wafers and flip chips with terminals adapted for connection to patterns of joining material formed on carrier substrates.

In one aspect of the invention a highly conductive paste is screened into patterns formed in photoresist. This allows the connection between the contact and the paste to be tested before the paste is cured. An aqueous or semiaqueous photoresist may be used because the joining material cures at a low temperature or at least hardens sufficiently at a low temperature to allow the photoresist to be removed without damaging the pattern of joining material formed around the photoresist. Using such aqueous developed resists and to some extent using semiaqueous developed resists, reduces problems with organic solvents such as environmental releases and chemical expenses. It has been discovered that some joining materials that must be cured at high temperatures may be partially cured at lower temperatures compatable with strippable photoresists. Photoresists have been identified which may be applied as a dry film to allow multiple layers of film to provide the desired thickness of joining material. Dry application allows rapid thickening of the resist without long processing delays required for solvent drying. The process provides for the small features required for flip chip attachment and also provides for large quantities of joining material required by ball grid array attachment into circuit substrates.

It has been discovered that a metal mask alone cannot easily produce the high aspect bumps required for connection using electrically conductive polymers, but that a mask may be useful in slightly overfilling openings in the photoresist so that shrinkage during curing of the photoresist results in filled openings in the phototresist. It has also been determined that bumps of electrically conductive materials may be formed with nearly planar top ends by drying the joining material in the photoresist pattern and rescreening and redrying the subsequently screened material.

When used for flip chip connection either with joining material on the chip or joining material on the substrate, the joints may be made very small, that is, less than about 10 mils. When used to attach components on circuit boards, many layers may be quickly provided to allow photoresist thicknesses greater than about 15 mils.

It has been learned that the development process can be controlled to provided bumps of conductive material with a fillet at the bottom which makes the bumps much more rugged and less likely to be injured during stripping of the photoresist.

BRIEF DESCRIPTION OF THE DRAWINGS

FIGS. 4a–4e is a process flow of a single conductive layer of flex built with ECA.

FIGS. 10a–10d is the process flow for producing a ceramic module with conductive surfaces on both sides.

FIGS. 13a–13e is the process flow to produce chips with ECA terminals.

FIGS. 17a–17c is the process flow for making ECA and filling holes in the photoresist.

FIGS. 21a & 21b is the process flow of a ceramic flip chip module with ECA on the chip and on the module to card.

FIGS. 24a & 24b is the process flow of an alternative structure with ECA added between the chip and the module.

FIGS. 27a–27d is the process flow of a card with ECA added on both sides.

FIGS. 33a–33h is the process flow of a card with soldered SMT, PIH components and ECA connected components.

FIG. 34a is a partial, cross section of a card with SMT soldered components and ECA connected components.

FIG. 34b is a partial, cross section of a card with SMT and PIH soldered components as well as ECA connected components.

FIGS. 36a–36e is the process flow of placing ECA chips on a soldered module.

BEST MODE FOR CARRYING OUT THE INVENTION AND PREFERRED ALTERNATIVES

Figure 2:
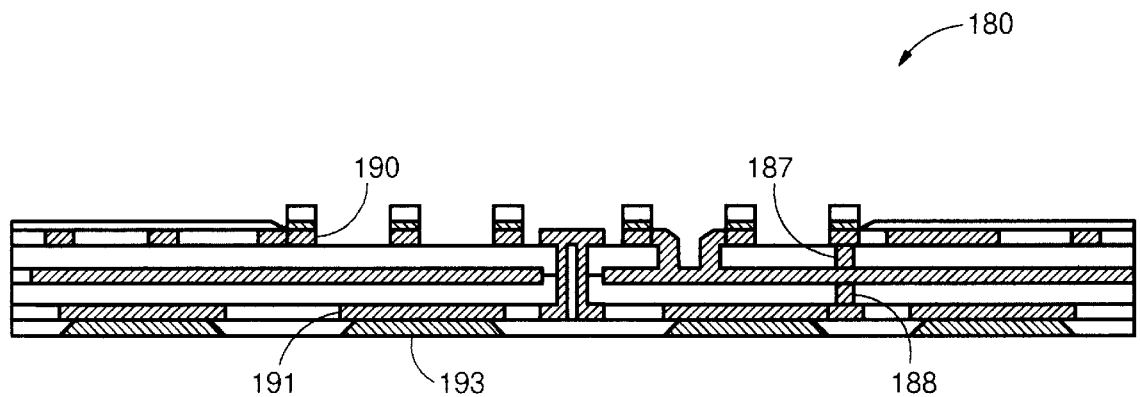
FIG. 2 is a cross section of a module that has been processed with ECA to form deposits on the connector pads.
Figure 3:
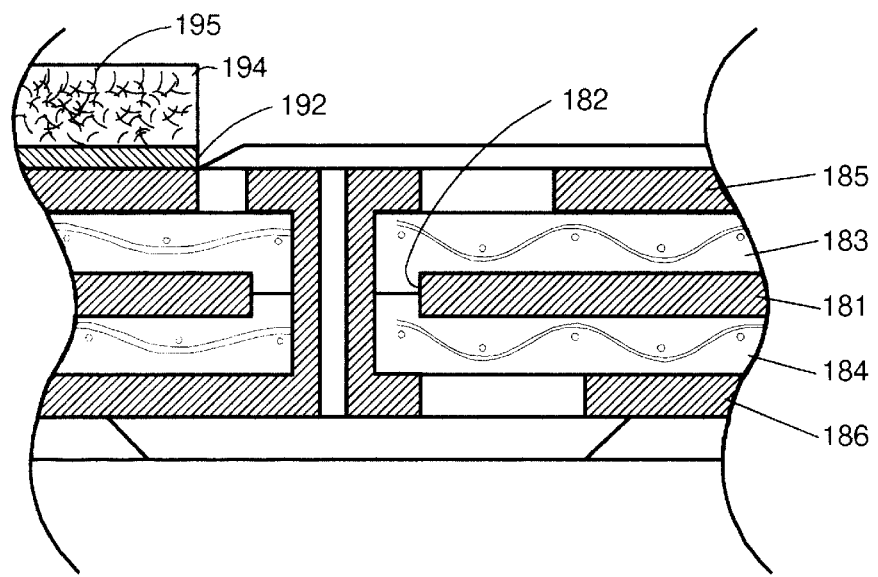
FIG. 3 is a partial, cross sectional enlargement of the central portion of FIG. 2.
Figure 4A:
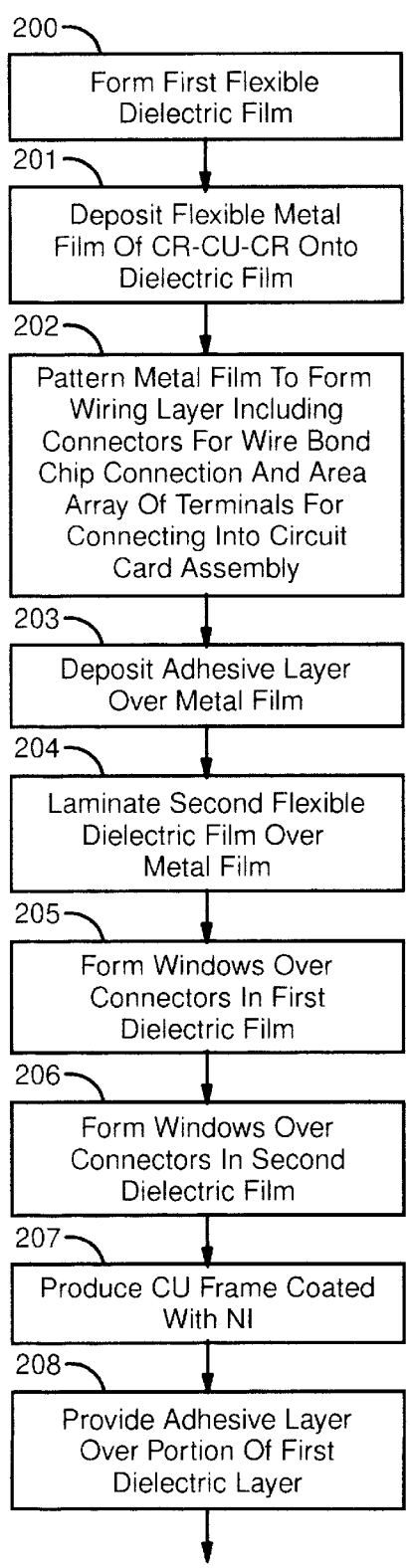
Figure 4B:
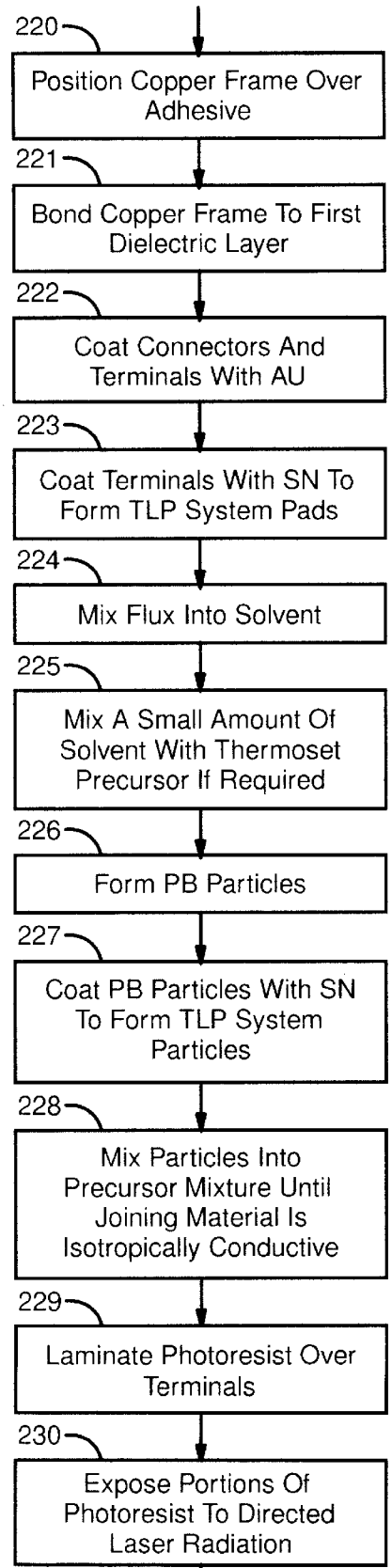
Figure 4E:
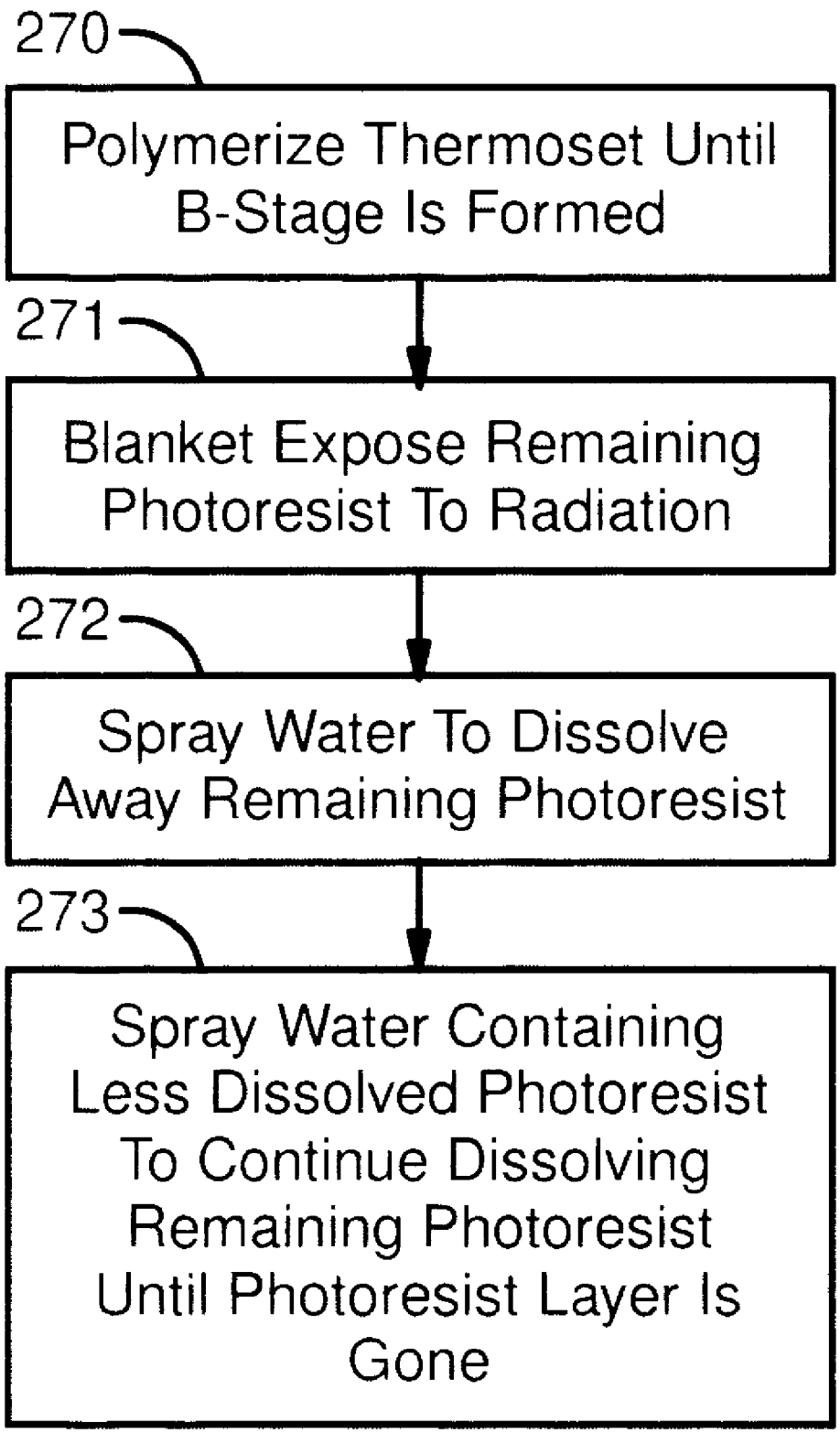

An example process of the invention will now be described in relation to FIGS. 1a–1e, which process results in the structure shown in FIGS. 2 and 3. FIGS. 1a–1e schematically illustrate an example embodiment of the process of the invention for producing carriers for flip chip connection of one or more computer chips and for subsequent connection in a circuit card assembly. FIG. 2 shows an example carrier manufactured by the process of FIGS. 1a–1e. FIG. 3 shows some details of the carrier of FIG. 2.

Figure 1A:
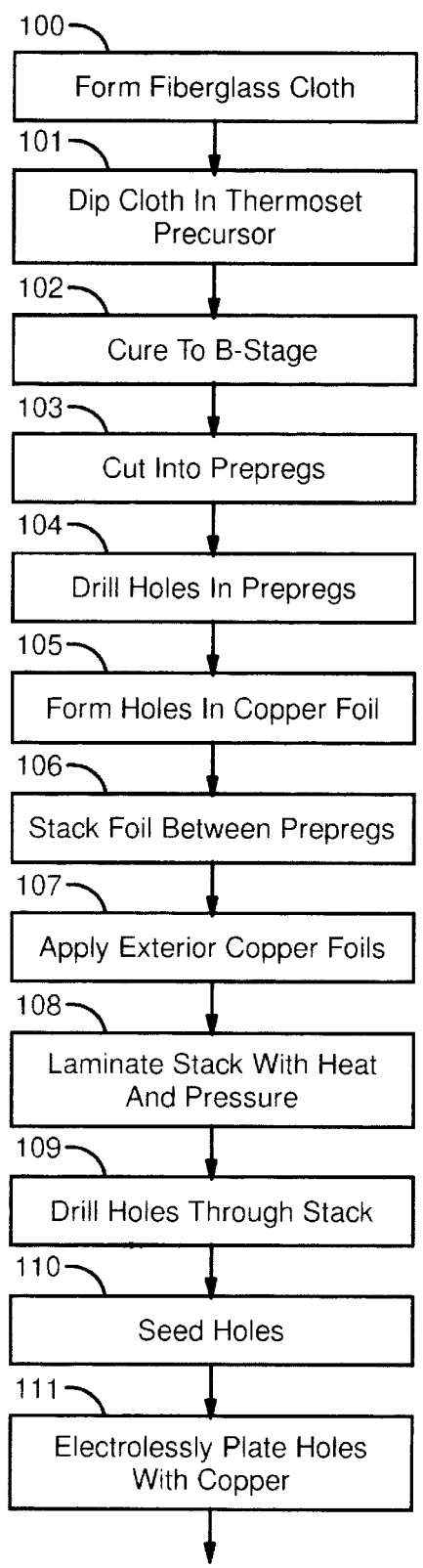
FIGS. 1a–1e is a process flow of a circuit card built with electrically conductive adhesive (ECA).
Figure 1B:
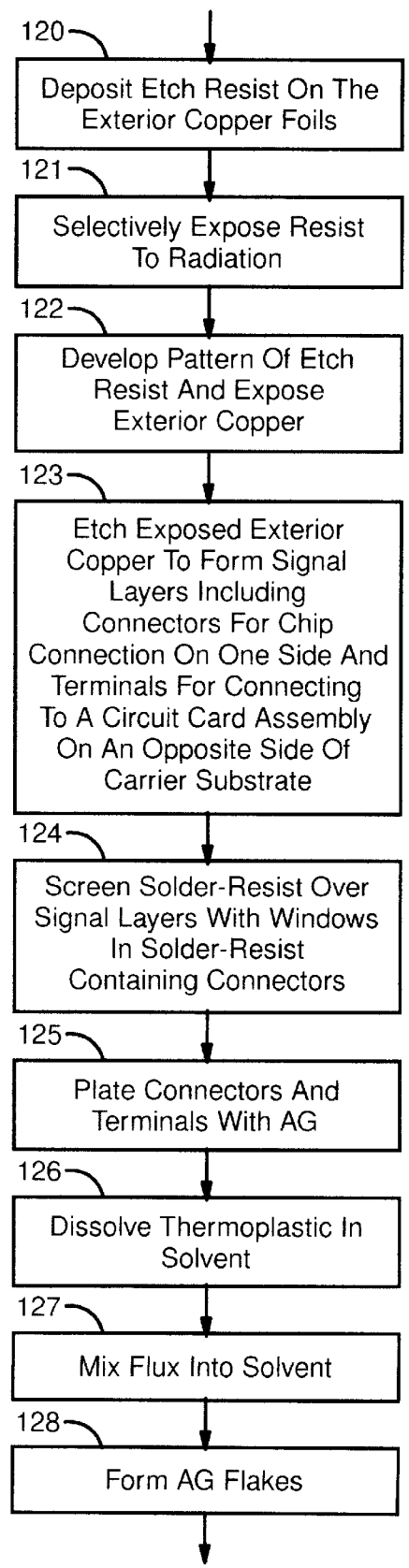
Figure 1C:
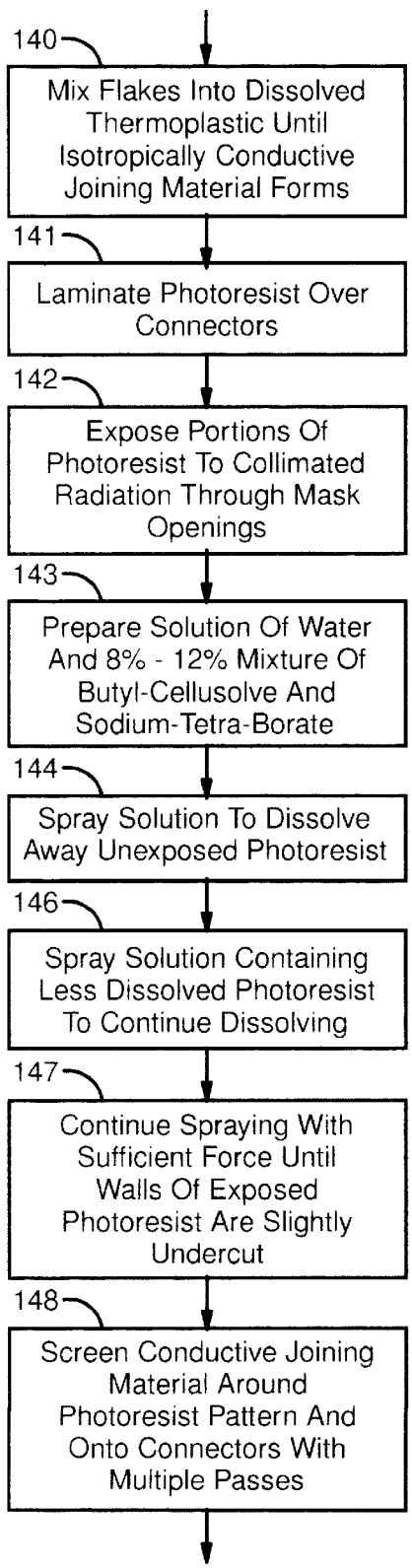
Figure 1D:
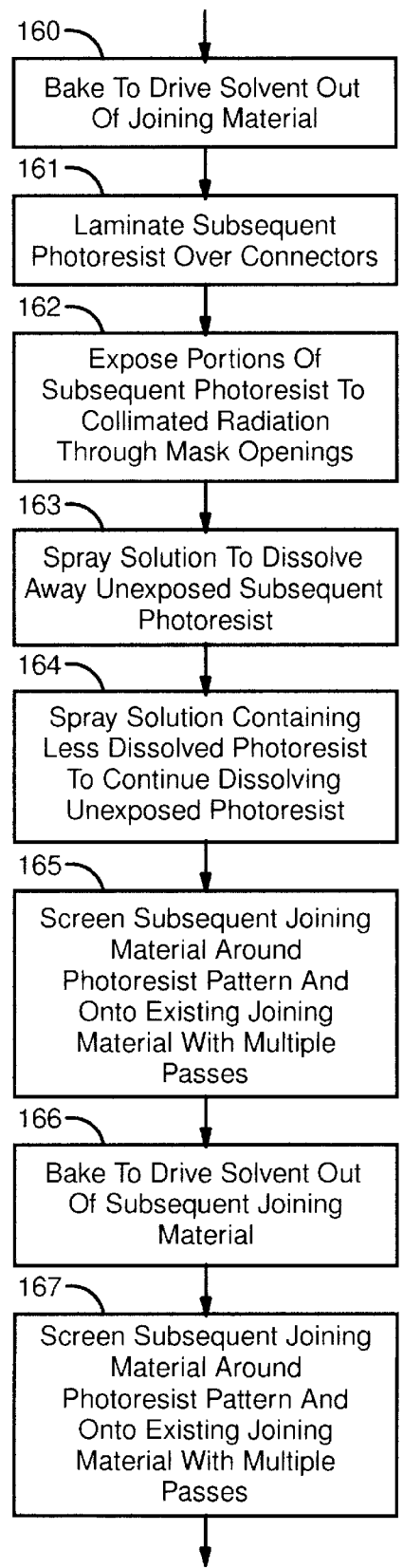
Figure 1E:
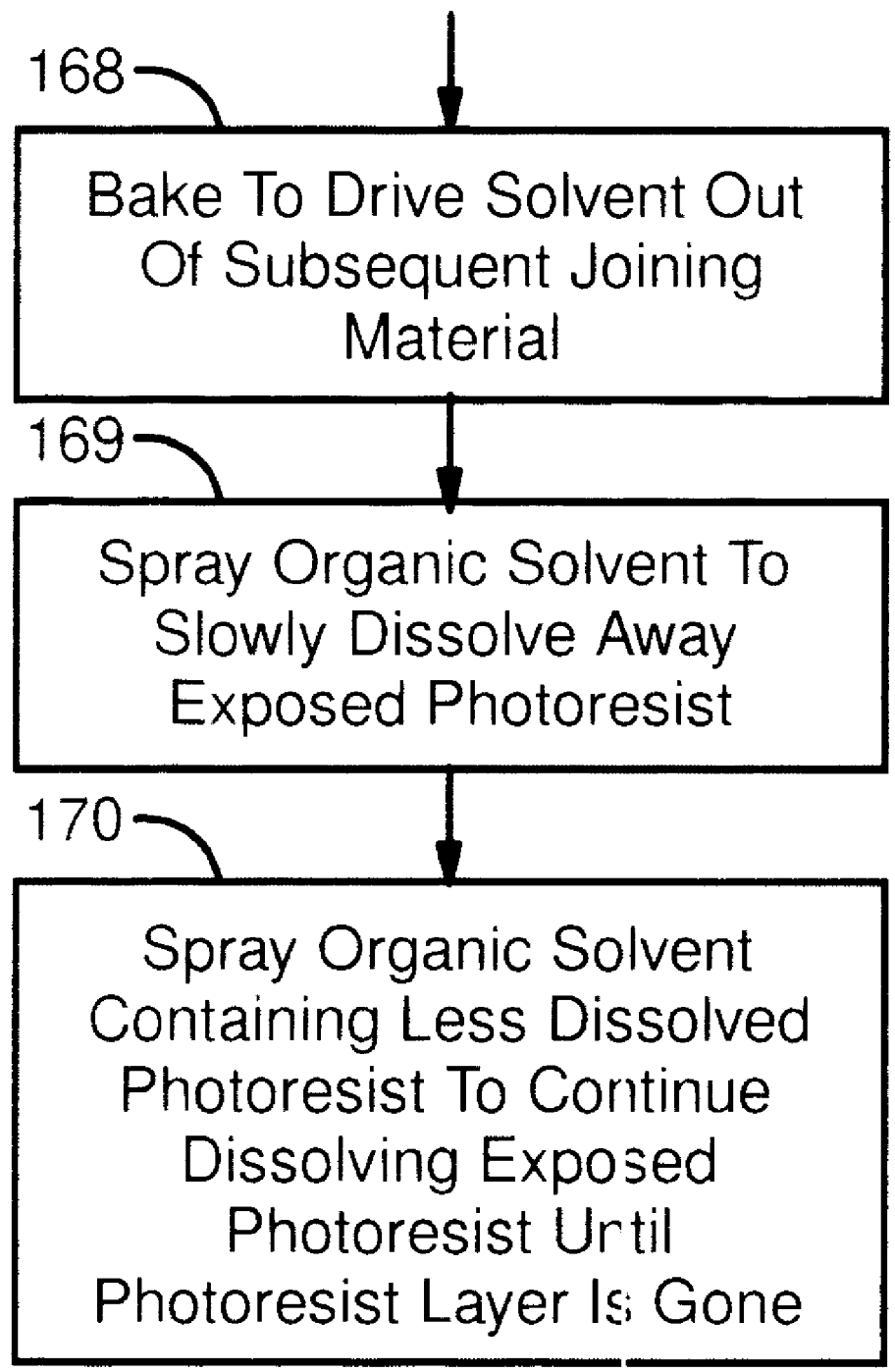

In step 100 of FIG. 1a, a fiberglass fabric is woven, and in step 101 the fabric is continuously dipped in a thermoset precursor. The thermoset may be an epoxy or a silicone or any material that can be controllably polymerized to form a stiff dry resin. The resulting fabric is heated or exposed to ultraviolet light to partially cure the thermoset to a B-stage in step 102. The B-stage is sticky and moldable by heat. In step 103 the fabric is cut into individual prepregs.

Holes are drilled in the prepregs in step 104. The holes allow electrical interconnection to be made through individual prepregs without having to form the hole completely through the card. Holes are commonly drilled in fiberglass epoxy prepregs by punching, laser drilling, or more commonly by twist drilling.

In step 105 holes are formed in a 0.5–2 oz per square foot copper foil to allow vias to be made through the circuit board without connecting to the foil. Such holes are commonly punched but could be made by laser or photolithographically by laminating an etchresist film onto both sides of the foil, exposing the foil to light, developing openings in the etchresist, and then etching holes in the foil. Photoresists are discussed in more detail below. The apertured foil is stacked between two prepregs to form a sandwich in step 106 And then in step 107 more copper foils are applied to the exterior of the sandwich to complete the stack. In step 108 the stack is laminated with heat and pressure to complete the curing of the thermoset and bond the foil to the thermoset to form a carrier substrate.

Holes are drilled through the stack in step 109 and in step 110 the holes are seeded for electroless plating. The seeding material is typically Sn and Pt which acts as a catalyst for the chemical plating. The seeded holes are electrolessly plated with copper in step 111. The plating may be limited to the holes by applying the seeding through a mask or by laminating on a photoresist prior to seeding and stripping the photoresist off prior to plating or by applying a photoresist after seeding so that copper is only plated where the seed layer is uncovered. The electroless plating may be followed by electroplating or a full electroless plating may be done.

In step 120 photoresist is deposited over the exterior copper foils. Photoresists include liquid applied photoresists and dry film laminated photoresists, and include positive acting photoresists and negative acting photoresists, and include organic solvent chemistry resists, semiaqueous chemistry photoresists, and fully aqueous chemistry photoresists. Liquid type photoresists are applied as a liquid using brushing, rolling, spraying, or more preferrably by spin coating. Then the liquid resist must be dried usually by baking in an oven for example at 80° C. for 30 minutes. Dry film photoresists are laminated with heat and pressure to surfaces so that the drying step may be eliminated. The dry films do not fill in as well around circuit details so etchants are more prone to bleeding under the resist. Liquid resists may be coated as thin as about 0.2 mils and possibly thinner by spin coating at high rpms. Organic chemistry resists are developed and stripped by applying an organic solvent. A commercially available liquid organic photoresist is T168. Aqueous photoresists are developed and stripped using water solutions containing surfactants and highly acidic or alkaline additives. A commercially available aqueous photoresist is GA40. Semiaqueous photoresists are developed using water based solutions as in aqueous resists, but must be stripped using organic solvents similar to organic resists, but the required solvents do not have to be as aggressive. Commercially available semiaqueous resists include AX by Morton, Riston* 4820, and Riston 4720 from E.I. DuPont de Nemours & Company.

*Riston is a Trademark of E.I. du Pont de Nemours & Co.

In step 121 the photoresist is selectively exposed to radiation. The selective exposure may be made by directing light from some source, through a lens system to produce collimated light (backwards through a telescope) which is directed through a pattern of openings in a photomask onto the etchresist. The radiation may be from a laser beam which is directed onto the mask by rastering, using a mirror system or by vectoring by moving a mirror or the laser head or the table on which the substrate is mounted. The selection of the source of radiation and the equipment required depends on the specific resist chosen. The radiation polymerizes a negative resist to make the radiated portion of the resist harder or depolymerizes a positive resist to soften it. In step 122 the exposed photoresist is developed by removing the softer portions of the resist to form a pattern of photoresist and exposed exterior copper on the surface. The developing is usually performed by spraying a solvent on the exposed resist which dissolves the softer portion of the photoresist away leaving the harder portion. The solvent may be organic or may be water based. In step 123 the exposed exterior copper is etched away to form signal layers under protective photoresist. The signal layer includes connectors for connecting one or more chips on one side of the carrier and terminals for connecting the carrier into a circuit card assembly, on the opposite side of carrier substrate.

In step 124 solder resist is screened over the conductive lines of the external wiring layers with windows exposing the connectors. Alternatively the solder resist may be applied as a dry film and photo imaged to provide windows over the connectors. Ag is deposited over the connectors and/or terminals of the carrier. Another noble metal may be used for a TLP system, Elements of the system may be deposited on the pads to provide compatible TLP bonding sites.

In step 125 the connectors and terminals are plated with Ag. It has been discovered that a coating of noble metal is required for reliable connection using either thermoplastic or thermoset electrically conductive adhesives (ECAs). The noble metal may be Au, Ag, Pt, Pd. Ag is selected in this case due to compatability with the Ag flakes in the ECA In step 126 the thermoplastic is dissolved in an organic solvent. The preferred thermoplastic is polyimide-siloxane because of its high temperature stability, high adhesion and mechanical strength, its elasticity, and high solubility in organic solvents. The solvent may include n-methylpyrilodone, xylene, and more preferrably acetophenone. In step 127, an oxygen scavenger or other type of deoxidizer may be added to the dissolved thermoplastic to improve the connection between particles during curing. Such fluxes should be no-clean type fluxes which vaporize or leave an inert residue after curing. Although most have not been tested with this invention, flux components that may be useful include abietic acid, adipic acid, ascorbic acid, acrylic acid, citric acid, maleic acid, polyacrylic acid or other organic acids with an electron withdrawing group such as fluorine, chlorine, bromine, iodine, sulfur, nitrile, hydroxyl, or benzyl groups.

In step 128 Ag flakes are formed. The flakes may be formed by mechanically flattening Ag particles in a press to produce a powder containing a high ratio of flakes to particles. Then the particles may be suspended in an expanding air flow to categorize them by air resistance. Then the air resistance categorized particles are sorted by size to separate flakes from much smaller compact particles. In step 140 the flakes are mixed into the dissolved thermoplastic until sufficient to form isotropically conductive joining material during subsequent curing. Ag flakes have a very low percolation threshold at which time the material switches from a high resistance material to a very low resistance material. The theoretical percolation threshold for Ag flakes that are 3 times as wide as they are thick is only about 16% by volume (about 25% by weight). More preferrably the material has as many particles as allows for screening. The preferred range is about 60 to about 90% Ag flakes by weight, more preferrably about 70 to about 85% Ag flakes. Preferably, the average width of the flakes is at least 2 times and more preferrably 3 times the average thickness of the flakes.

Alternately a commercially available ECAs such as Diemat and Staystik may be used.

Photoresist is laminated onto one side of the circuitized substrate, over the connectors in step 141. Photoresists include liquid resists which are applied by brushing, rolling or spin coating and dry film resists which are laminated with heat and pressure. Dry film resists include organic solvent developed resists such as T168; preferably aqueous developed dry film resists such as GA40; and more preferably semiaqueous resists such as AX by Morton, Riston 4820, and Riston 4720 from E.I. DuPont de Nemours Inc. Liquid resists are difficult to form into films thicker than 1 mil and require drying time after coating. In this specific example a semiaqueous resist is selected.

In step 142 photoresist is exposed to collimated radiation directed through openings in a photomask.

A solution of water and 8%–12% mixture of butyl-cellusolve and sodium-tetra-borate is prepared on step 143. In step 144 the solution is sprayed onto the circuitized substrate to dissolve away unexposed photoresist. The spraying is preferably in multiple stages in which the spray solution containing less dissolved photoresist in order to efficiently continue the dissolving in step 146. The spraying is continued with sufficient force until walls of exposed photoresist are slightly undercut at step 147. At step 148 conductive joining material is screened around the photoresist pattern and onto the connectors of the wiring layer. Preferably the screening includes multiple passes in multiple directions. The conductive joining material should at least be screened in a first direction across the substrate and then in an approximately opposite direction. It may be useful to also screen in directions perpendicular to the first screening directions especially if the pattern includes openings for conductive lines between the pads.

In step 160 the joining material is cured. The cuting in this case comprises heating the material sufficient to drive the solvent out. Preferably essentially all the solvent is driven out of the joining material. If one layer of photoresist is not thick enough to produce structures of the desired height then in step 161 a subsequent layer of photoresist is laminated onto the first layer over the connectors. In step 162 the same portions of the subsequent photoresist are exposed to collimated radiation through mask openings as were exposed in the first layer of photoresist. Again in step 163 and 164 the photoresist is developed and in steps 165 and 166 joining material is screened and cured as before. This process allows very thick photoresist structures to be formed with very small tolerances. If larger tolerances are allowed then it may be possible to laminate several layers of photoresist at one time or sequentially and to expose multiple layers in one step and develop them all in one step. The one developing step may comprise multiple spraying stages. If multiple layers of photoresist are used then alternatively, the screening may be done only after the last photoresist layer is developed or only at selected times during the building of the photoresist structure. The joining material has to be at least partially cured before another photoresist is developed or the rinsing away may disturb the uncured paste. For a thermoplastic joining material and for solder paste joining materials there tends to be a large amount of shrinkage during curing, possibly as high as 50% shrinkage. If there is significant shrinkage then after the final photoresist is laminated and developed and the paste is screened into the last photoresist and cured, then preferably the process includes one or more additional steps each consisting of the steps of screening subsequent joining material around the final photoresist pattern and onto the existing joining material with multiple passes and then at least partially curing the joining material as shown by steps 167–170.

FIG. 2 illustrates a specific embodiment of the invention of a carrier 180 for flip chip connection of one or more computer chips and subsequent connection in a circuit card assembly. FIG. 3 illustrates a portion of another embodiment of the invention of FIG. 2. Central copper foil 181 with holes 182 forms a power plane. The central core is covered by fiberglass epoxy plies 183 and 184 and external foils 185 and 186 which are patterned to form signal layers. Conductive vias 187 and 188 (FIG. 2) extend through plies 183 and 184 respectively to connect between the signal layers 185 and 186 respectively and power plane 181. The external signal layers are coated with solder resist to protect the lines from the environment and to prevent any solder used for connection from running down the signal lines. The solder resist also helps prevent the ECA from connecting to the signal lines to allow the ECA to be formed into surface wiring (see FIG. 5) between the pads.

The signal layers include pads 190 for connecting a flip chips and copper pads 191 for connecting the carrier into a circuit board assembly. The pads of the connectors and terminals are coated with another metal layer 192 and 193 respectively. Preferably the other metal is a noble metal such as Pt, Pd, Au, or Ag which is required for connection of an ECA filled with individual conductive particles. For an electrically conductive polymer ECP which uses a transient liquid phase TLP interconnection system, preferably the other metal is compatable with the TLP system. For example for a TLP system of Pb particles coated with Sn, the other metal may be a coating of Pb over the copper and a coating of Sn over the Pb or vice versa to promote interconnection to the particles during curing. For a joining material of solder particles in a polymerizable and then vaporizable base or low temperature sinterable particles, a noble metal surface would prevent oxidation but would not be necessary. The noble metal on the terminals allows the carrier to be connected to bumps of ECA on a wiring board.

The connection pads are covered with thermoplastic 194 filled with Ag flakes 195.

FIGS. 4a–4e illustrate another embodiment of the process of the invention for producing carriers for flip chip connection of one or more computer chips and subsequent connection in a circuit card assembly. In step 200 a flexible dielectric film is produced. The film may be a polyester and more preferably the film is polyimide such as KAPTON* or UPILEX for resistance to high temperatures. A flexible metal film is deposited on the dielectric film in step 201. The film may be deposited by covering the dielectric film with an adhesive layer and then laminating with copper foil or by laminating Cr over Cu foil, or more preferably by dry depositing Cr-Cu-Cr onto the dielectric film. In step 202 the metal film is patterned photolithographically as previously discussed to form a wiring layer on one side of the dielectric film. The wiring layer includes connectors for connecting a flip chip or wire bond chips and terminals for connection into a circuit board assembly. Preferably the wiring is patterned after it is deposited on the dielectric layer. In step 203 an adhesive layer may be deposited over the metal film, and in step 204** a second flexible dielectric film is deposited over metal film. Alternatively, a dielectric film may be laminated directly to a Cr-Cu-Cr metal layer.

*Trademark of E.I. du Pont de Nemours & Co.
**Trademark of ICI Americas, Wilmington, D.E.

In step 205 windows are formed over the connectors in the first dielectric film, and in step 206 windows are formed over the terminals in the second dielectric film.

In step 207 a copper frame is produced. Preferably the frame has the same external dimensions as the carrier substrate. Preferably the Cu frame is coated with chromate conversion or more preferably coated with Ni. In step 208 an adhesive layer is provided over portion of first dielectric layer for attaching the frame to the carrier. Preferably the adhesive is a flexible epoxy or more preferably a silicone. Preferrably a bulk adhesive is screened onto the carrier. The copper frame is positioned over the adhesive in step 220, and in step 221 the copper frame is bonded to the first dielectric layer and the adhesive is cured.

In step 222 the connectors and terminals are coated with Au and in step 223 the terminals are coated with Sn to form TLP pads that are compatable with a TLP particle system discussed below. In step 224 a flux is mixed into a solvent. Then a small amount of the solvent is mixed with a thermoset precursor in step 225. The amount of solvent required for thermoset precursors is less than 10% and usually less than 5%. Alternatively, the flux may be mixed directly with the precursor. Solvent may not be required for some resin systems. In step 226 Pb particles are formed, and at step 227 the particles are coated with Sn to form the TLP system particles. Tin immersion may be used to coat the Pb particles with Sn. In step 228 the particles are mixed into the precursor. Preferably enough of the particles are added to make the joining material isotropically highly conductive. However, the joining material does not have to be conductive until it is cured.

In step 229 photoresist is laminated over the terminals. In this embodiment an aqueous photoresist is applied. In step 230 portions of photoresist are exposed to directed laser radiation. Water is sprayed to dissolve away the exposed photoresist to form a photoresist pattern in step 240, and in another processing step 241 water containing less dissolved photoresist is sprayed, to continue dissolving exposed photoresist. At step 242 the spraying continues with sufficient force for sufficient time until walls of unexposed photoresist are slightly undercut. In step 243 the conductive joining material is screened around a photoresist pattern and onto terminals, with multiple passes, and in step 244 the joining material is baked to drive solvent out of the joining material.

In step 245 subsequent photoresist is laminated over terminals. In step 246 portions of subsequent photoresist are exposed to directed laser radiation.

In step 247 water is sprayed to dissolve away exposed photoresist. In step 260 water containing less dissolved photoresist is sprayed to continue dissolving exposed photoresist. In step 261 subsequent joining material is screened around photoresist pattern and onto existing joining material with multiple passes. In step 262 baking drives solvent out of subsequent joining material. In step 263 a metal mask is treated with a low surface energy coating. In step 264 a metal mask is positioned over a photoresist pattern with openings corresponding to existing joining material. In step 265 subsequent joining material is screened into a mask pattern and onto existing joining material with multiple passes. In step 266 solvent is baked out of subsequent joining material. In step 267 the metal mask is lifted off the photoresist. In step 270 the thermoset is polymerized until B-stage is formed. In step 271 the remaining photoresist is blanket exposed to radiation. In step 272 water is sprayed to dissolve away remaining photoresist. In step 273 water containing less dissolved photoresist is sprayed to continue dissolving remaining photoresist until the photoresist layer is gone.

Figure 5:
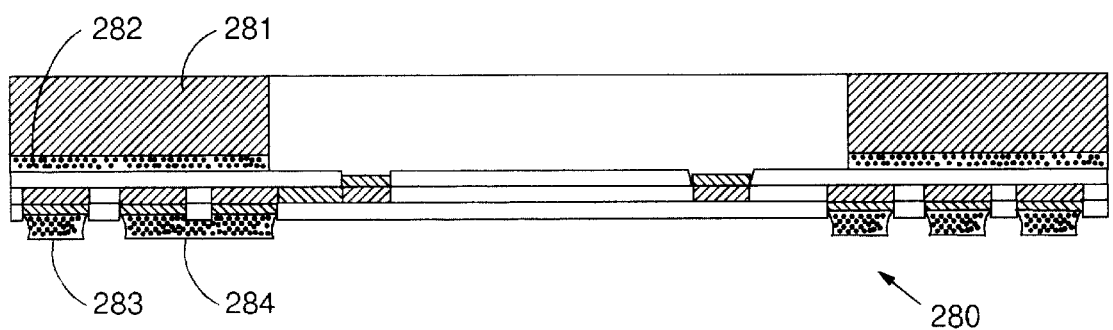
FIG. 5 is a cross section of a module made with flex that has ECA to form deposits on the connector pads.

FIG. 5 illustrates a flexible dielectric film module 280 that is attached to a metallic stiffener 281 by adhesive 282. The cylindrically shaped ECA connections 283 are shown in place of a spherically shaped solder structure. A shorted ECA structure 284 can be easily accommodated at this level.

Figure 6:
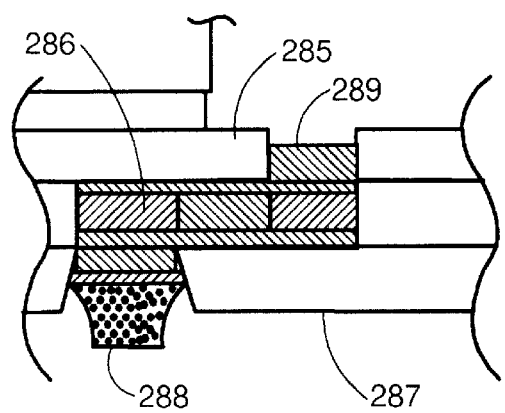
FIG. 6 is a partial, cross sectional enlargement of the central portion of FIG. 5.
Figure 7A:
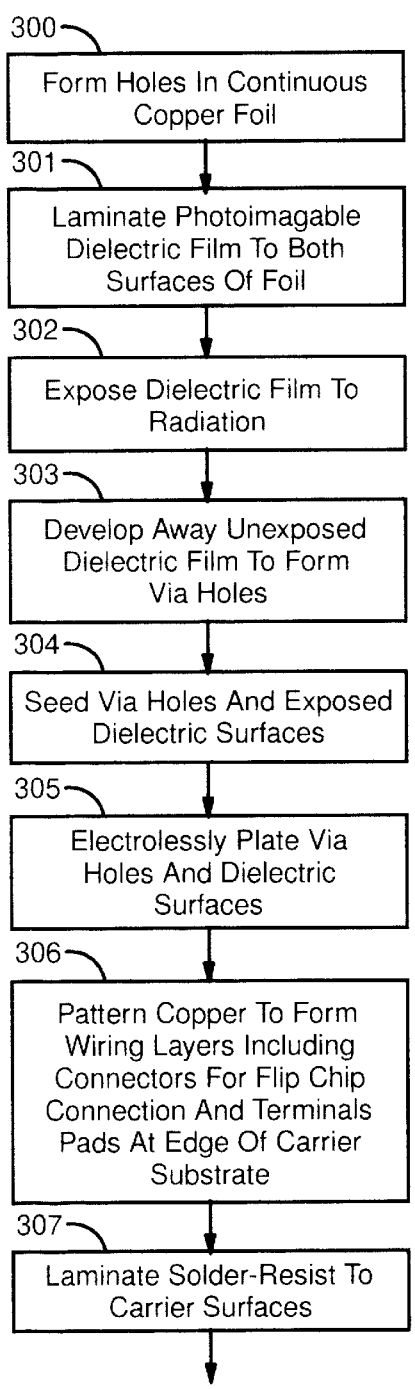
FIGS. 7a–7d is a process flow of an alternative thin card structure.
Figure 7B:
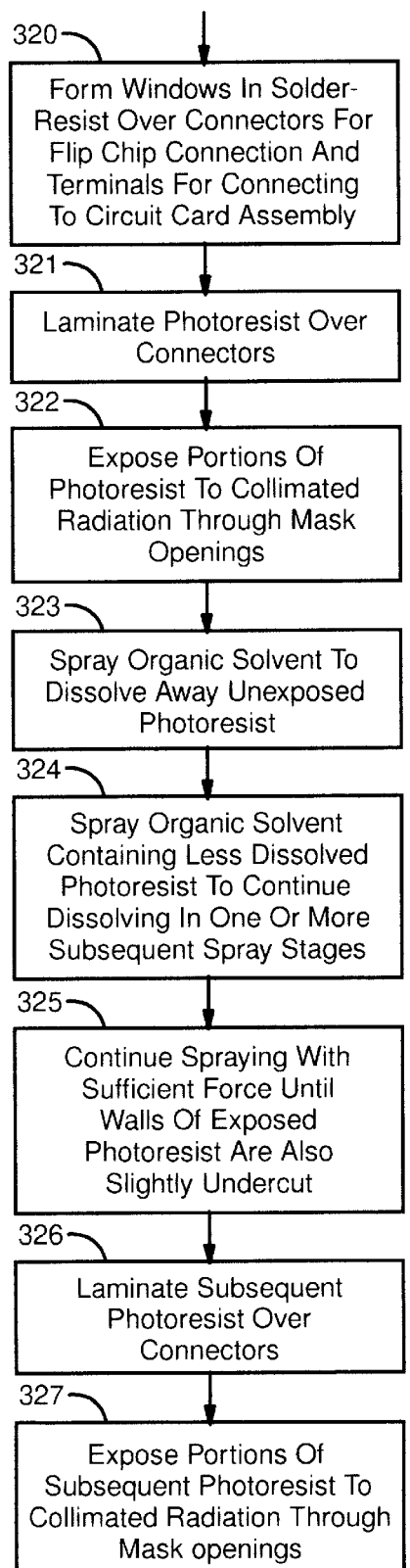
Figure 7C:
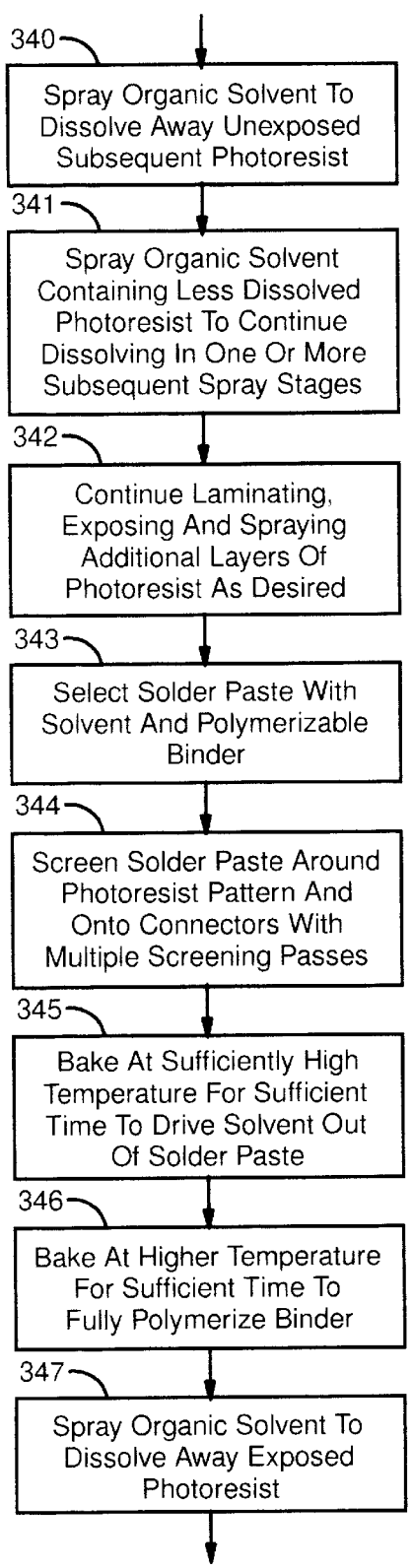
Figure 7D:
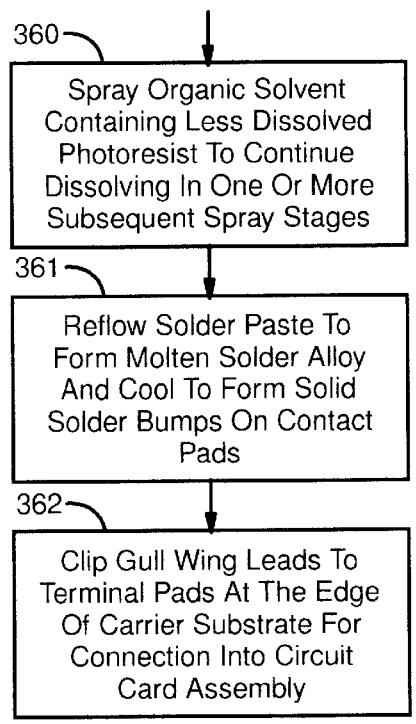

FIG. 6 is an enlargement of FIG. 5 that shows the first dielectric layer 285 and the circuit path 286 and the adhesive layer 287. The electrical connection would be through the ECA pad 288 then the circuit path 286 and finally thru the chip pad 289.

FIGS. 7a–7d illustrate another embodiment of the process of the invention for producing carriers for flip chip connection of one or more computer chips and subsequent connection in a circuit card assembly. In step 300 holes are formed in continuous copper foil. In step 301 photoimagable dielectric film is laminated to both surfaces of foil. In step 302 the dielectric film is exposed to radiation. In step 303 unexposed dielectric film is developed away to form via holes. In step 304 via holes are seeded and dielectric surfaces exposed. In step 305 via holes and dielectric surfaces are electrolessly plated. In step 306 copper is patterned to form wiring layers including connectors for flip chip connection and terminal pads at the edge of a carrier substrate. In step 307 solder-resist is laminated to carrier surfaces. In step 320 windows are formed in the solder-resist over connectors for flip chip connection and terminals for connecting to circuit card assembly. In step 321 photoresist is laminated over connectors. In step 322 portions of photoresist are exposed to collimated radiation through mask openings. In step 323 organic solvent is sprayed to dissolve away unexposed photoresist. In step 324 organic solvent containing less dissolved photoresist is sprayed to continue dissolving in one or more subsequent spray stages. In step 325 spraying is continued with sufficient force until the walls of exposed photoresist are also slightly undercut. In step 326 subsequent photoresist is laminated over connectors. In step 327 portions of subsequent photoresist are exposed to collimated radiation through mask openings. In step 340 organic solvent is sprayed to dissolve away unexposed subsequent photoresist. In step 341 organic solvent containing less dissolved photoresist is sprayed to continue dissolving in one or more subsequent spray stages. In step 342 laminating, exposing and spraying additional layers of photoresist is continued as desired. In step 343 solder paste is selected with solvent and the binder is polymerized. In step 344 solder paste is screened around a photoresist pattern and onto connectors with multiple screening passes. In step 345 baking at a sufficiently high temperature for a sufficient time drives solvent out of the solder paste. In step 346 baking at a higher temperature for a sufficient time fully polymerizes the binder. In step 347 organic solvent is sprayed to dissolve away exposed photoresist. In step 360 organic solvent containing less dissolved photoresist is sprayed to continue dissolving in one or more subsequent spray stages. In step 361 solder paste is reflowed to form molten solder alloy and cooled to form solid solder bumps on contact pads. In step 362 gull wing leads are clipped to terminal pads at the edge of carrier substrate for connection into circuit card assembly.

Figure 8:
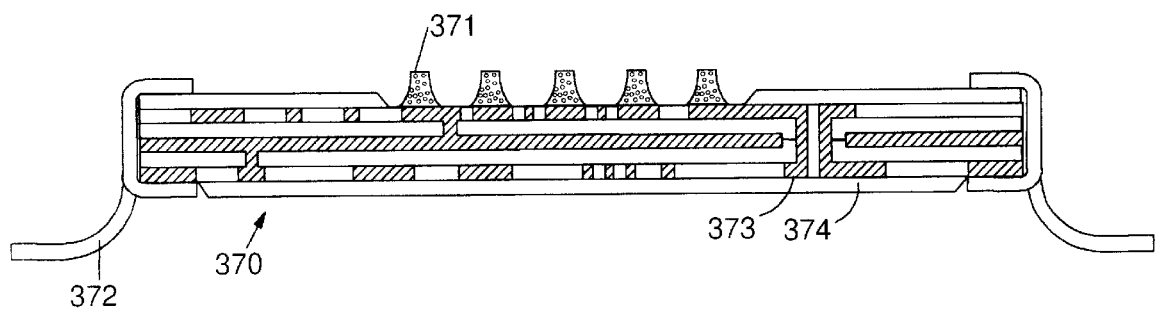
FIG. 8 is cross section of a thin card module.

FIG. 8 illustrates a gull wing leaded module 370 that has a two conductive layered thin dielectric structure that has ECA features 371 in the chip area. The conductive path travels either at that level to the clipped gull wing 372 or thru a via 373 then across the second conductive layer 374, then to the gull wing lead.

Figure 9:
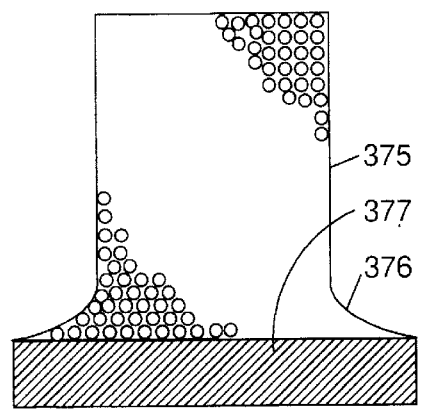
FIG. 9 is an enlargement of the shape of a typical ECA form.
Figure 10C:
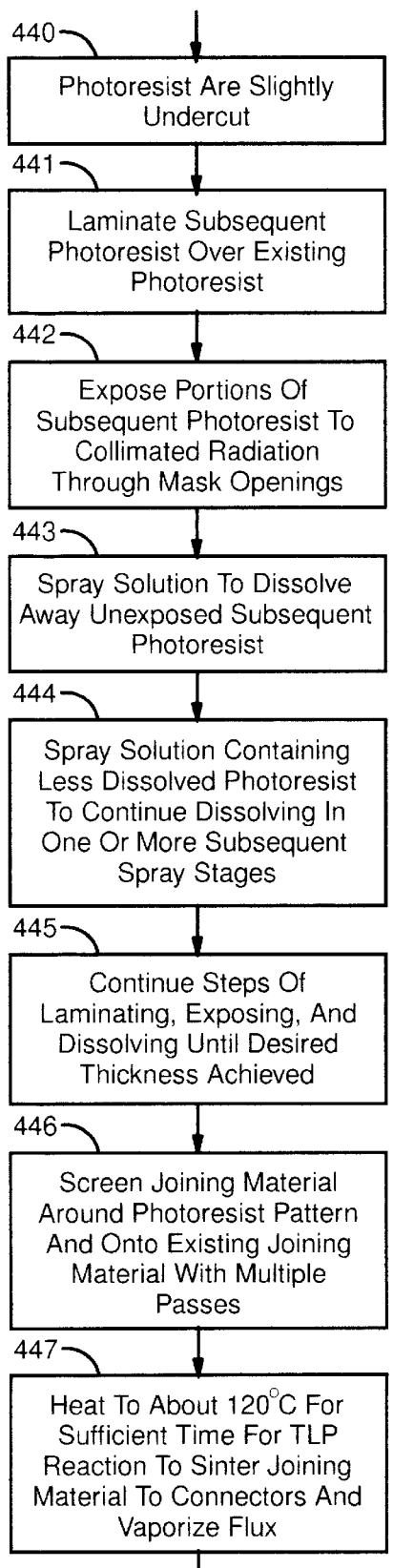
Figure 10D:
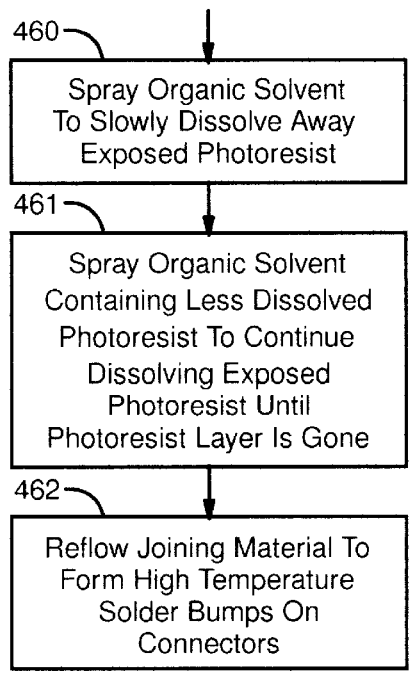

FIG. 9 is an enlarged view of a typical ECA site. The ECA material 375 is mostly cylindrically shaped. The bottom of the site has a slight concave form 376 to eliminate high stress concentration where it is connected to the conductive pad 377.

FIGS. 10a–d illustrate yet another embodiment of the invention by means of a process flow for producing a ceramic module with ECP surfaces.

In step 400 ceramic particles, solvent, and binder are mixed to form a slurry. In step 401 the slurry is pressed and dried to form a greensheet. In step 402 holes are punched in the greensheet. In step 403 a mask is positioned on the greensheet. In step 404 conductive ink is screened into holes and into openings in the mask onto the greensheet. In step 405 the mask is lifted off. In step 406 the ink is baked to dry it. In step 407 one or more greensheets are stacked and aligned. In step 408 sufficient heat and pressure is applied to form a continuous ceramic substrate with flip chip connectors on a connection surface and ball grid pads on an opposite surface. In step 409 particles of Pb are formed. In step 410 particles with 5% Sn by weight are plated. In step 420 smaller particles of In are formed. In step 421 about 5% by weight of In particles are mixed with the plated Sn particles. In step 422 particles are mixed with about 20% by weight liquid flux to form joining material. In step 423 photoresist is laminated over the connectors. In step 424 portions of photoresist are exposed to collimated radiation through mask openings. In step 425 a solution of water and 8%–12% mix of butyl-cellusolve and sodium-tetra-borate is prepared. In step 426 the solution is sprayed to dissolve away unexposed photoresist. In step 427 a solution containing less dissolved photoresist is sprayed to continue dissolving in one or more subsequent spray stages. In step 440 spraying with sufficient force is continued until walls of exposed photoresist are slightly undercut. In step 441 subsequent photoresist is laminated over existing photoresist. In step 442 portions of subsequent photoresist are exposed to collimated radiation through mask openings. In step 443 the solution is sprayed to dissolve away unexposed subsequent photoresist. In step 444 a solution containing less dissolved photoresist is sprayed to continue dissolving in one or more subsequent spray stages. In step 445 the steps of laminating, exposing, and dissolving are continued until desired thickness is achieved. In step 446 joining material is screened around a photoresist pattern and onto existing joining material with multiple passes. In step 447 heat of about 120° C. is applied for sufficient time for TLP reaction to sinter joining material to connectors and vaporize flux. In step 460 organic solvent is sprayed to slowly dissolve away exposed photoresist. In step 461 organic solvent containing less dissolved photoresist is sprayed to continue dissolving exposed photoresist until the photoresist layer is removed. In step 462 joining material is reflowed to form high temperature solder bumps on connectors.

Figure 11:
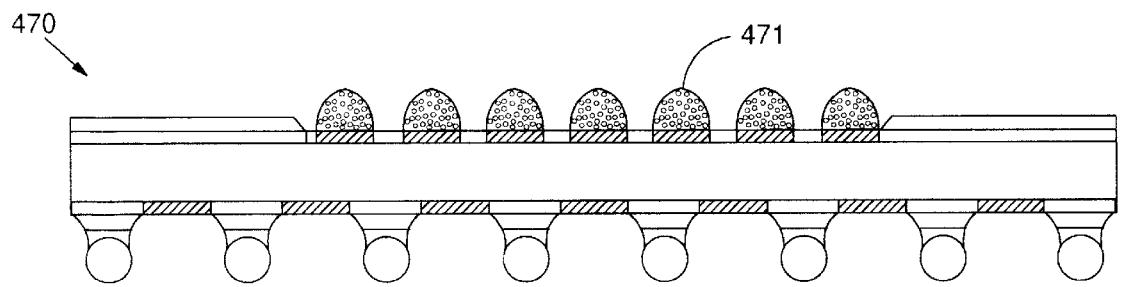
FIG. 11 is a cross section view of a ceramic module that has ECA on one side.

FIG. 11 is a cross section that shows a ceramic module 470 that has been processed with ECA at the chip site 471.

Figure 12:
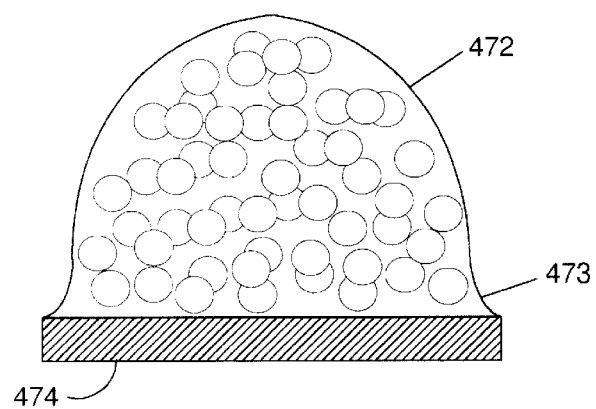
FIG. 12 is an enlargement of the shape of an alternative ECA form at one site.
Figure 13A:
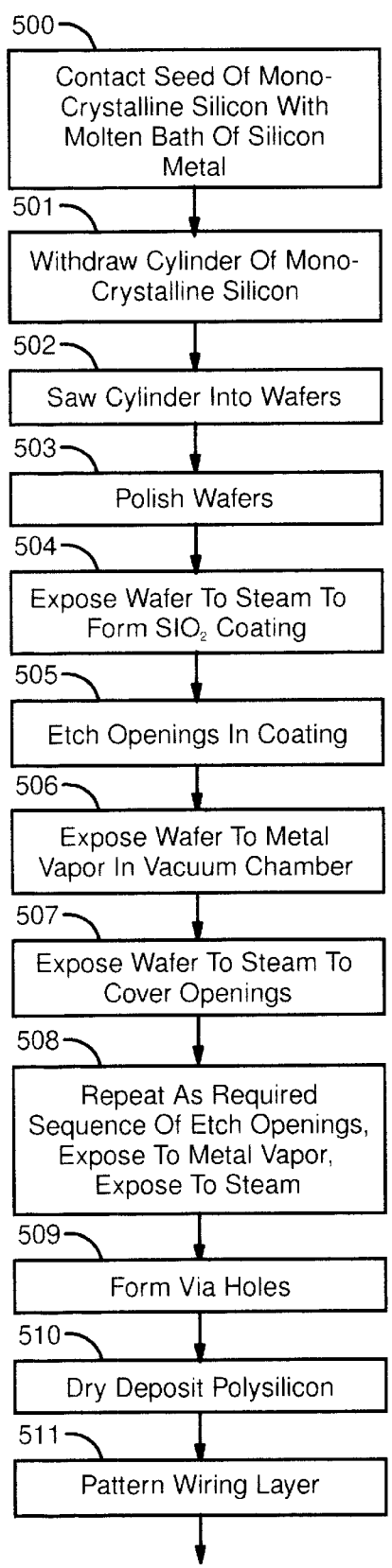
Figure 13B:
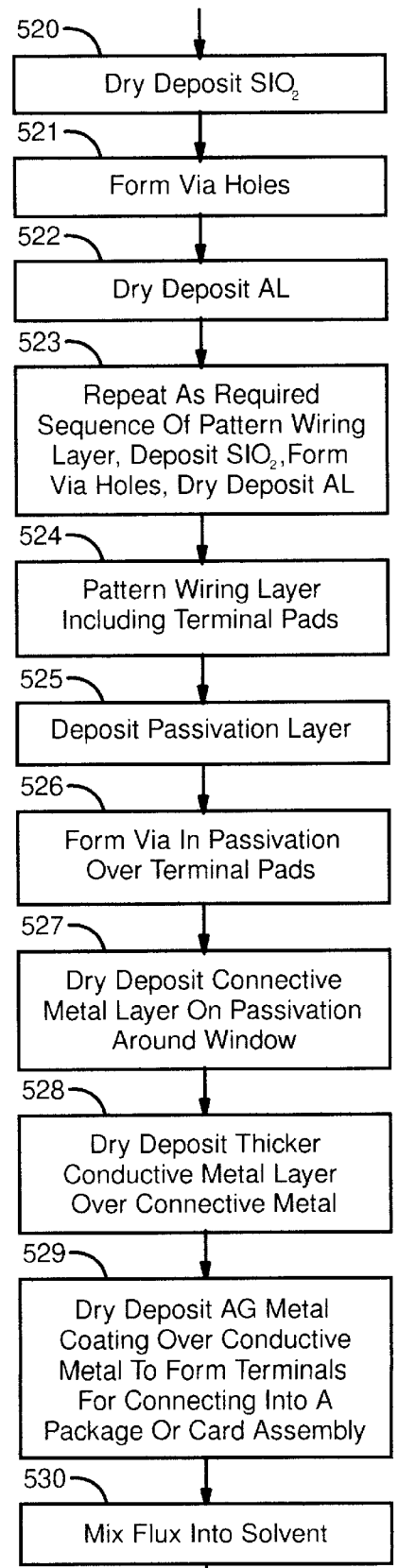
Figure 13E:
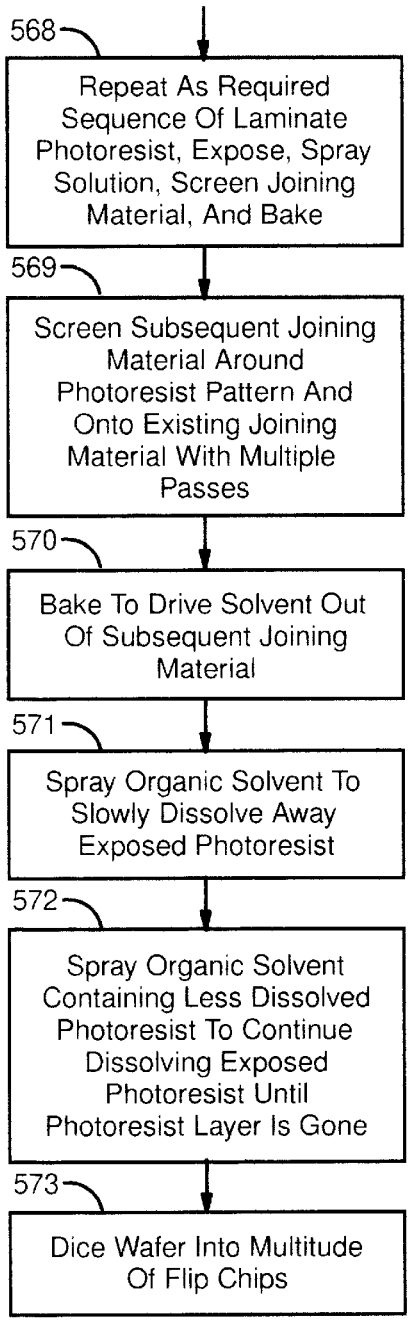

FIG. 12 is an enlarged view of an alternative ECA form 472. The shape is mostly hemispherical but the concave shape 473 near the conductive pad 474 is to eliminate high stress concentration.

FIGS. 13a–e illustrate yet another embodiment of a process flow for making chips with ECA terminals.

In step 500 a seed of mono-crystalline silicon is brought in contact with a molten bath of silicon metal. In step 501 a cylinder of mono-crystalline silicon is withdrawn. In step 502 the cylinder is sawed into wafers. In step 503 the wafers are polished. In step 504 a wafer is exposed to steam to form a $SiO_2$ coating. In step 505 openings are etched in the coating. In step 506 the wafer is exposed to metal vapor in a vacuum chamber. In step 507 the wafer is exposed to steam to cover openings. In step 508 a sequence of etch openings, expose to metal vapor, expose to steam is repeated as required. In step 509 via holes are formed. In step 510 polysilicon is dry deposited. In step 511 a wiring layer is patterned. In step 520 $SiO_2$ is dry deposited. In step 521 via holes are formed. In step 522 Al is dry deposited. In step 523 the sequence of pattern wiring layer, deposit $SiO_2$, form via holes, dry deposit Al is repeated as required. In step 524 the wiring layer is patterned including terminal pads. In step 525 a passivation layer is deposited. In step 526 vias are formed in the passivation layer over terminal pads. In step 527 a connective metal layer is dry deposited on passivation around window. In step 528 a thicker conductive metal layer is dry deposited over connective metal. In step 529 Ag metal coating is dry deposited over conductive metal to form terminals for connecting into a package or card assembly. In step 530 flux is mixed into a solvent. In step 540 thermoplastic is dissolved in solvent. In step 541 conductive Ag flakes are formed. In step 542 flakes are mixed into dissolved thermoplastic until isotropically conductive joining material is formed. In step 543 photoresist is laminated over terminals. In step 544 portions of photoresist are exposed to collimated radiation through mask openings. In step 545 a solution of water and 8%–12% mixture of butyl-cellusolve and sodium-tetra-borate is prepared. In step 546 a solution is sprayed to dissolve away unexposed photoresist. In step 547 solution containing less dissolved photoresist is sprayed to continue dissolving. In step 548 spraying with sufficient force is continued until walls of exposed photoresist are slightly undercut. In step 560 conductive joining material is screened around a photoresist pattern and onto terminals with multiple passes. In step 561 baking drives solvent out of the joining material. In step 562 subsequent photoresist is laminated over terminals. In step 563 portions of subsequent photoresist are exposed to collimated radiation through mask openings. In step 564 a solution is sprayed to dissolve away unexposed subsequent photoresist. In step 565 solution containing less dissolved photoresist is sprayed to continue dissolving unexposed photoresist. In step 566 subsequent joining material is screened around photoresist pattern and onto existing joining material with multiple passes. In step 567 baking drives solvent out of subsequent joining material. In step 568 the sequence of laminate photoresist, expose, spray solution, screen joining material, and bake is repeated as required. In step 569 subsequent joining material is screened around photoresist pattern and onto existing joining material with multiple passes. In step 570 baking drives solvent out of subsequent joining material. In step 571 organic solvent is sprayed to slowly dissolve away exposed photoresist. In step 572 is sprayed organic solvent containing less dissolved photoresist is sprayed to continue dissolving exposed photoresist until the photoresist layer is removed. In step 573 the wafer is diced into several flip chips.

Figure 14:
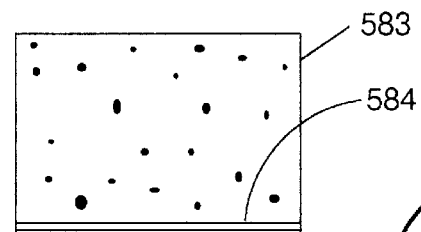
FIG. 14 is a partial, enlarged cross section of a typical chip structure with ECA terminals.
Figure 14:
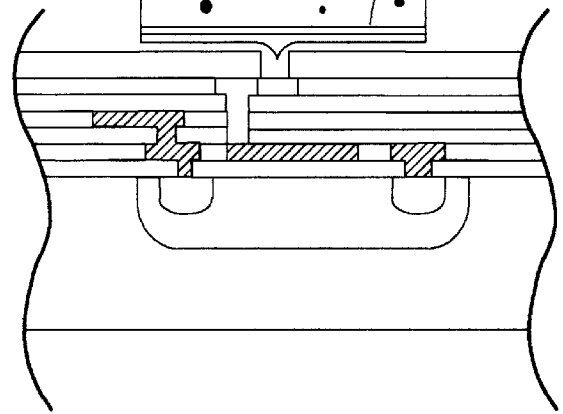

FIG. 14 is an enlarged cross section that shows an alternative totally cylindrical ECA bump 583 attached to the metalized ball limited metallurgy (BLM) pad 584.

Figure 15:
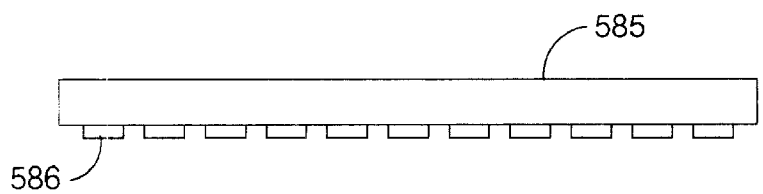
FIG. 15 is an end view of a chip with ECA bumps.

FIG. 15 is an end view of a diced chip 585 with ECA bumps 586.

Figure 16:
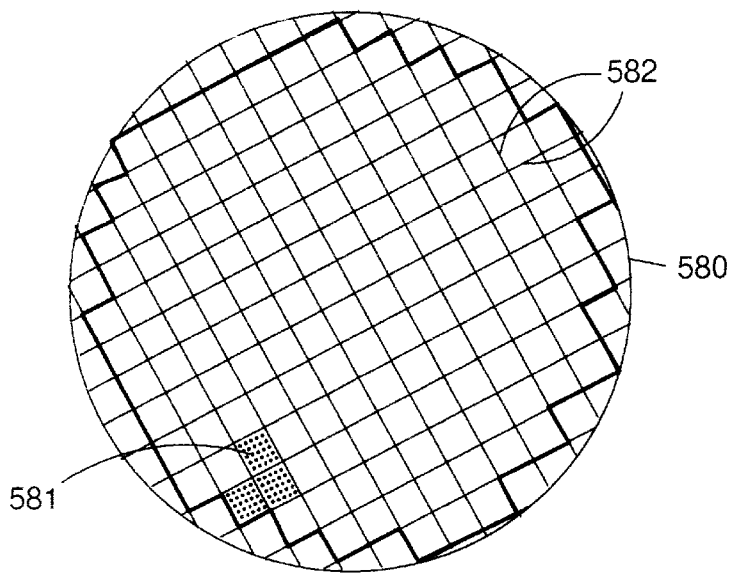
FIG. 16 is a top view of a wafer that has been diced.

FIG. 16 is a top view of a diced wafer 580, having individual chips 582 that has had ECA bumps 581 added.

Figure 17C:
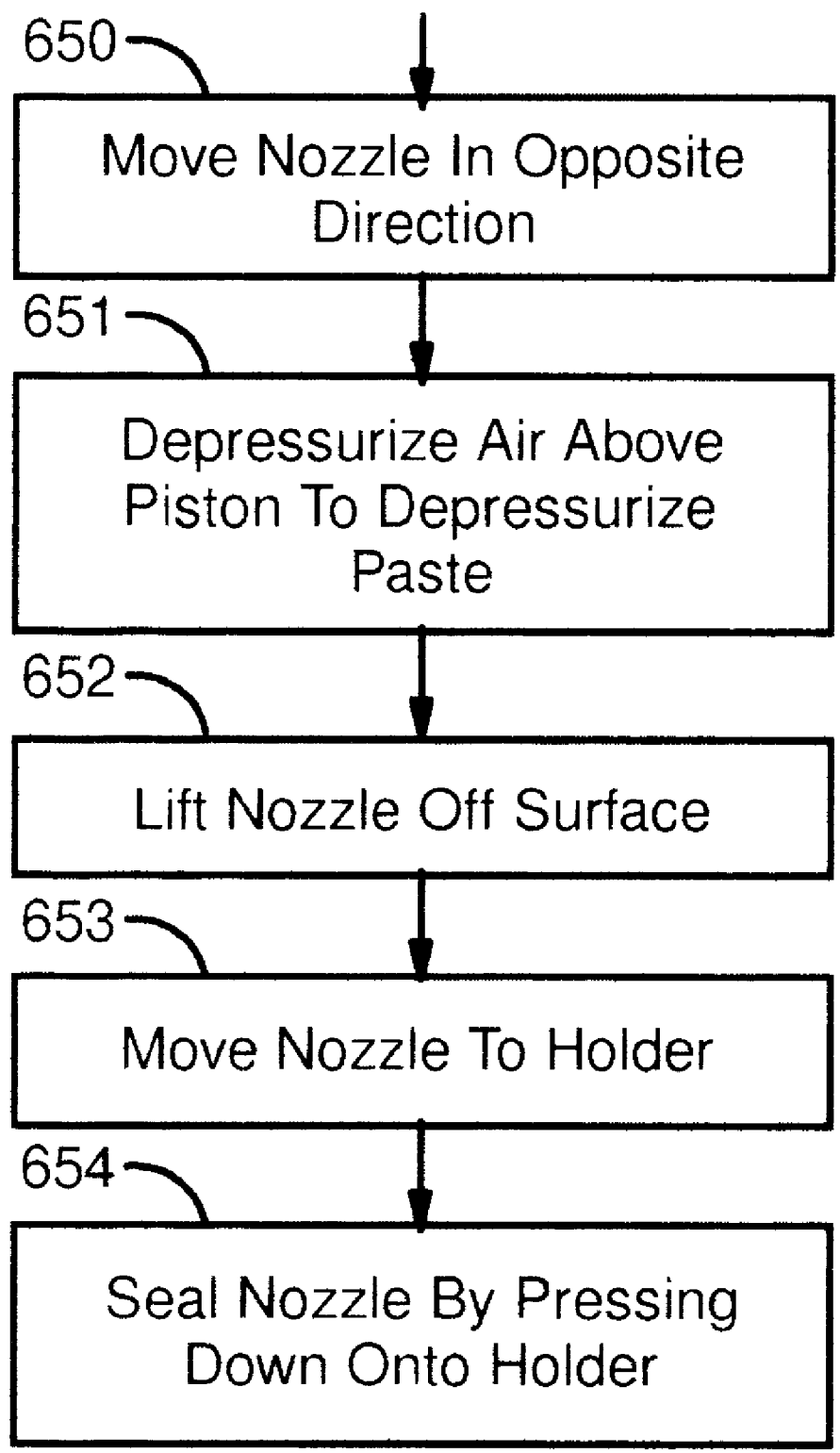

FIGS. 17a–c illustrates a process flow for applying ECA to a semiconductor wafer using a screening machine with a screening head and nozzle.

In step 600 thermoplastic is dissolved in an organic solvent. In step 601 Cu particles are formed. In step 602, particles are coated with Au. In step 603 particles are mixed into dissolved thermoplastic until the paste is isotopically electro-conductive. In step 604 a semiconductor wafer is provided with a photoresist coating having holes exposing Au pads. In step 605 a screening head is provided with a piston and elongated nozzle. In step 606 a screening machine is provided to move the head. In step 607 a source of pressurized air is provided. In step 608 a holder is provided to seal the nozzle. In step 609 paste is introduced into the enclosure below the piston. In step 620 the nozzle is unsealed by lifting from holder. In step 621 the nozzle is moved to a planar surface. In step 622 the nozzle is placed on the surface. In step 623 pressurized air is introduced above the piston to pressurize the paste. In step 624 the nozzle is moved laterally across surface. In step 625 the nozzle is moved in the opposite direction. In step 626 air above the piston is depressurized to depressurize the paste. In step 627 the nozzle is lifted off the surface. In step 628 the nozzle is rotated 90°. In step 629 the nozzle is placed on the surface. In step 630 pressurized air is introduced above piston to pressurize paste. In step 631 the nozzle is moved laterally across surface. In step 650 the nozzle is moved in the opposite direction. In step 651 air above the piston is depressurized to depressurize the paste. In step 652 the nozzle is lifted off surface. In step 653 the nozzle is moved to the holder. In step 654 the nozzle is sealed by pressing down onto the holder.

Figure 18:
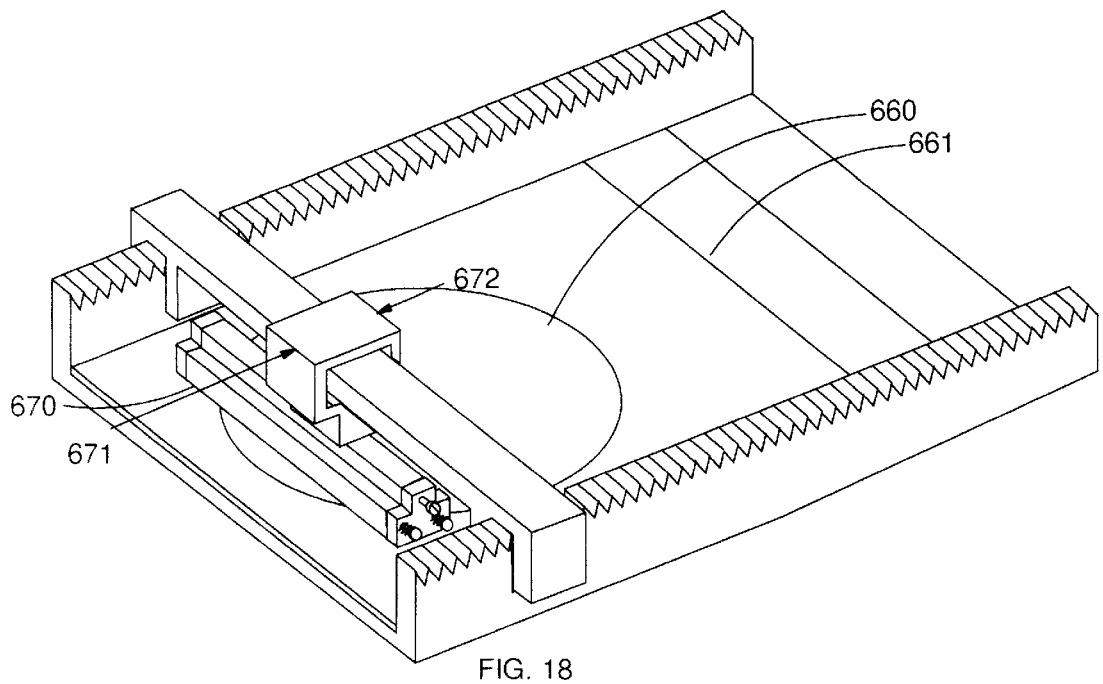
FIG. 18 is an isometric view of a screening machine.
Figure 19:
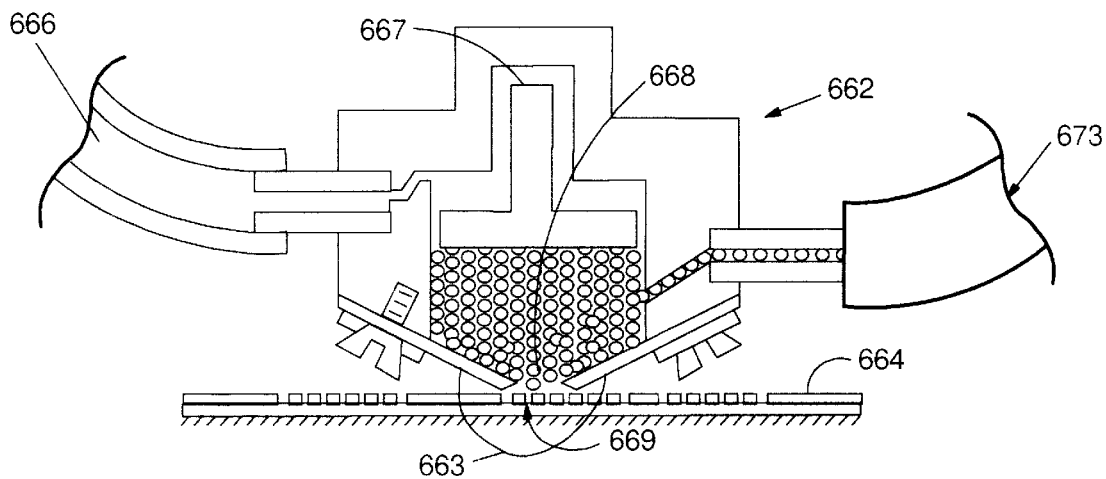
FIG. 19 is an end view cross section of an ECA dispensing head.

FIG. 18 illustrates a screening mechanism. The wafer 660 is placed in a fixture 661 and located in the screening machine. The nozzle 670, shown as an end view in FIG. 19 is lowered in the Z direction and a certain amount of force is applied to keep the blades 663 in intimate contact with the resist on the wafer 664. The blades are thin to conform to the resist surface without leaking. Pneumatic pressure through opening 666 is applied to the piston 667 and therefore the ECA material is forced thru the blade openings 668, and into the holes formed in the resist 669. The screening machine moves the nozzle 670 laterally 671. The ECA material is forced into the openings in the resist as the nozzle travels over the features. If several passes are needed, the screening machine stops and reverses direction 672 and returns to its original position.

An ECA fill port 673 is pressurized when the nozzle is down and against the resist. As more ECA enters the cavity, the piston 667 is pressurized with ECA material, and it retracts upwards.

Figure 20:
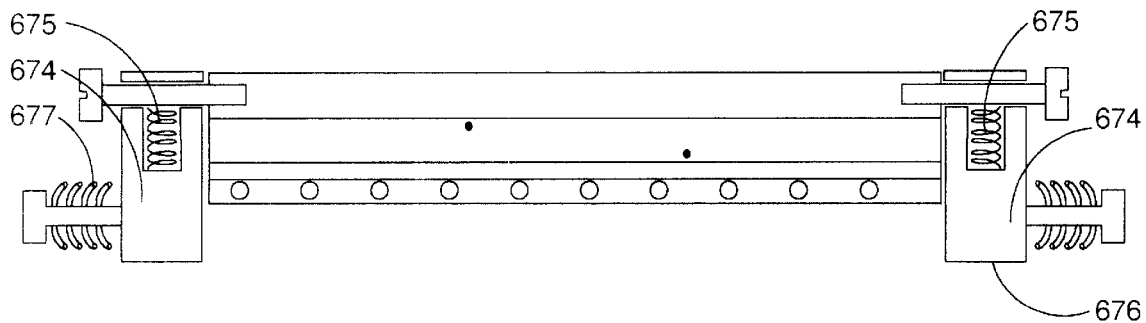
FIG. 20 is a side view cross section of an ECA dispensing head.

FIG. 20 is a side view of the dispense head. The end skids 674 are spring 675 loaded downward, to keep the bottom surface 676 in contact with the resist. The end skids also keep the ECA material from leaking out the ends of the blades, because these are spring 677 loaded towards the piston, and are closely fitted to the ends of the blades 663.

FIGS. 21a–b illustrates another embodiment with a process flow for joining a flip chip to a ceramic substrate and forming ECA terminals on the ceramic substrate.

In step 700 a flip chip is produced with bumps of Pb particles connected together with Sn-Bi-In ternary solder. In step 701 a ceramic substrate is produced with conductive vias. In step 702 Cr-Cu-Cr wiring is dry deposited on both surfaces including connectors on the top surface and terminals on the bottom surface. In step 703 Au is dry deposited on connectors and terminals. In step 704 a chip with bumps is positioned on the connectors. In step 705 the substrate is heated to 320° C. to reflow bumps. In step 706 the chip is encapsulated with thermoset filled with dielectric particles. In step 707 a heat spreader plate is bonded over the flip chip. In step 708 a silicone adhesive filled with dielectric particles is use to encapsulate between plate and top of ceramic substrate. In step 720 the thermoplastic is heated and silver particles are mixed in to produce electro-conductive thermoplastic. In step 721 a photoresist is applied over terminals. In step 722 the photoresist is exposed to radiation. In step 723 the photoresist pattern is developed. In step 724 the sequence of: apply, expose, develop is repeated until the photoresist is sufficiently thick. In step 725 hot electroconductive thermoplastic is screened around photoresist pattern and onto terminals. In step 726 the thermoplastic is cooled to harden it.

Figure 22:
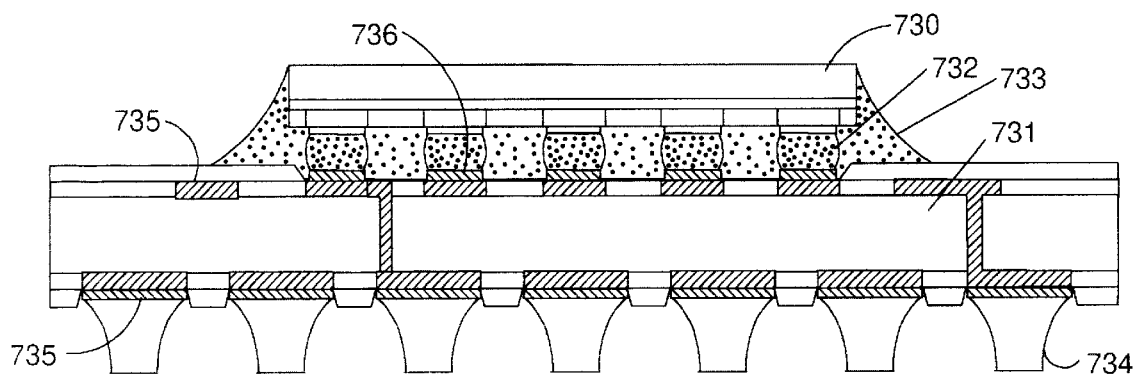
FIG. 22 is a cross section of a ceramic module and flip chip using ECA on the chip, in the vias and on the module.
Figure 23:
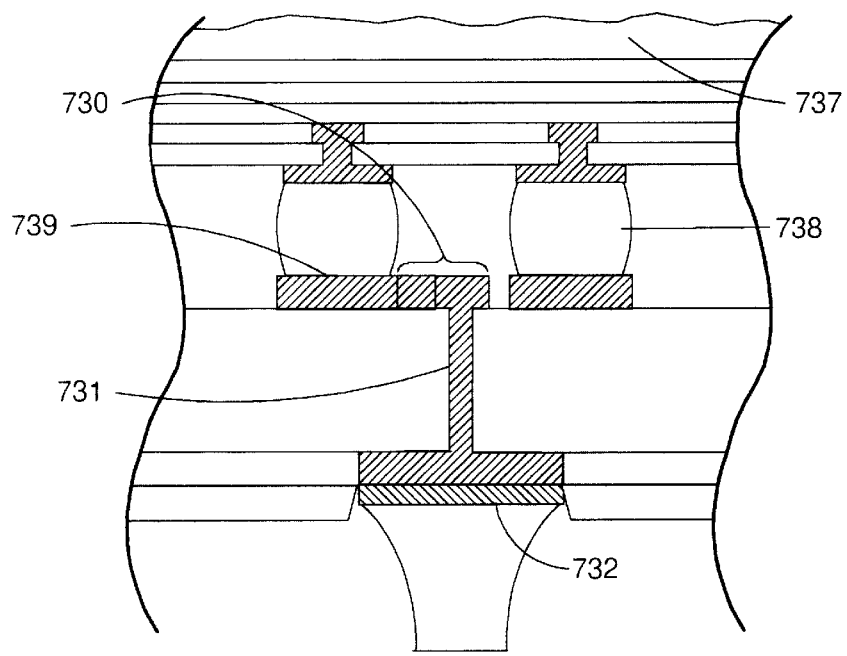
FIG. 23 is a partial, cross sectional enlargement of FIG. 22.

FIG. 22 is a cross section view of a substrate 731 that is metalized 735 on both sides. A chip 730 is placed on the chip pads 736 and the solder 732 is reflowed, then the chip is encapsulated 733. The ECA grid features 734 are then added to complete the module. FIG. 23 shows the conductive path between the chip 737, C4 solder joint 738, the chip pads 739, circuit path 730, the thru via 731 and the ECA ball pad 732.

FIGS. 24a–b illustrates an embodiment with a process flow for joining a flip chip to an organic carrier with ECA.

In step 750 a flip chip is produced bumped with electroconductive thermoplastic filled with Cu particles coated with Bi/In solder. In step 751 a plate of Cu-invar-Cu is formed. In step 752 openings are drilled through plate. In step 753 openings are filled and surfaces of plate are coated with polyimide. In step 754 isolated holes are drilled through plate in openings. In step 755 a seed layer is deposited in holes and on polyimide surface of plate. In step 756 photoresist is deposited over plate. In step 757 the photoresist is exposed to laser radiation. In step 758 the photoresist pattern is developed. In step 759 copper is electroplated on the exposed seed layer. In step 770 photoresist is stripped, and the exposed seed layer is etched away. In step 771 screen solder resist is screened over copper wiring with windows for chip connectors and terminals. In step 772 Pd is deposited on connectors and terminals. In step 773 a flip chip with polymer bumps is positioned on connectors. In step 774 the package is heated up to 220° C. In step 775 a pressure of 200 psi is applied to chip for about 10 seconds. In step 776 the package is allowed to cool.

Figure 25:
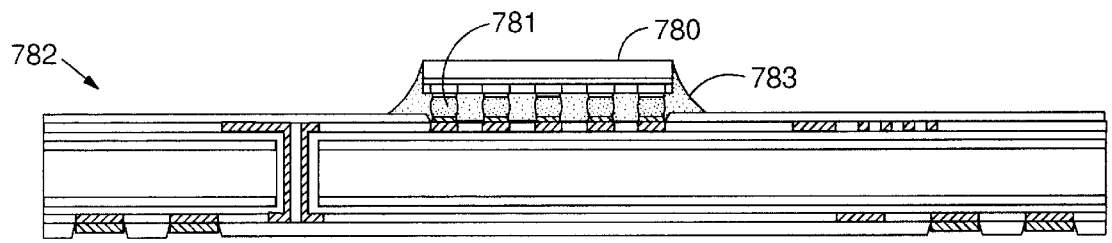
FIG. 25 is a cross sectional view of a thin module with the chip attached to it with ECA.

FIG. 25 illustrates a cross section of a module (782) that a chip (780) has been attached to by ECA bumps (781) then encapsulated (783).

Figure 26:
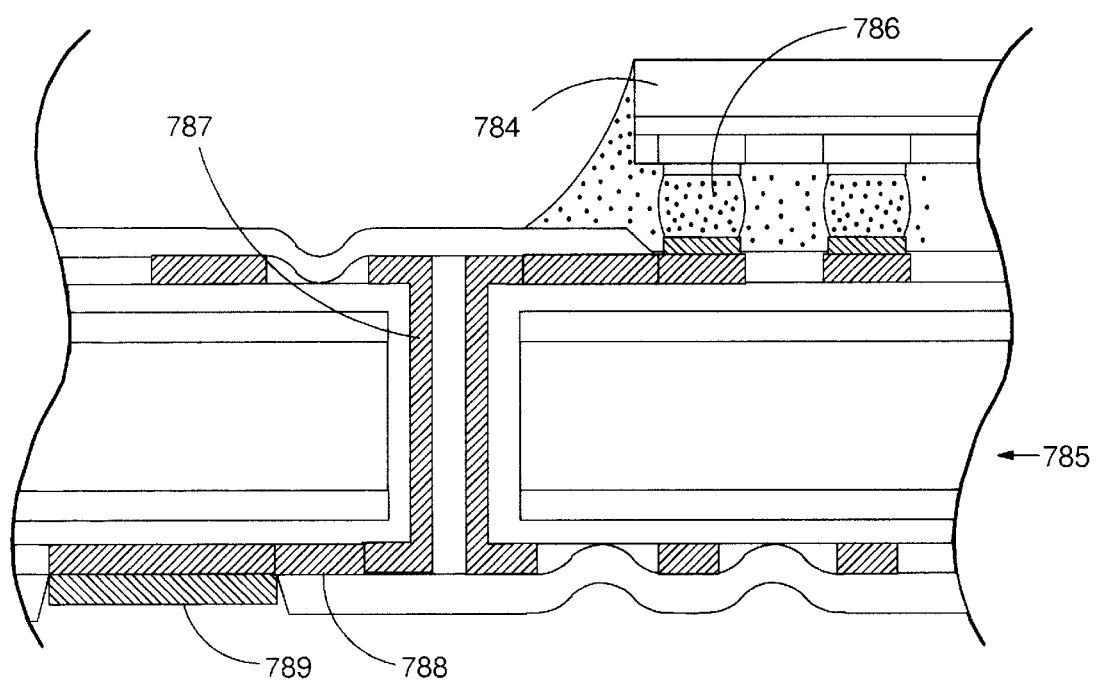
FIG. 26 is a partial, cross sectional enlargement of FIG. 25.
Figure 27C:
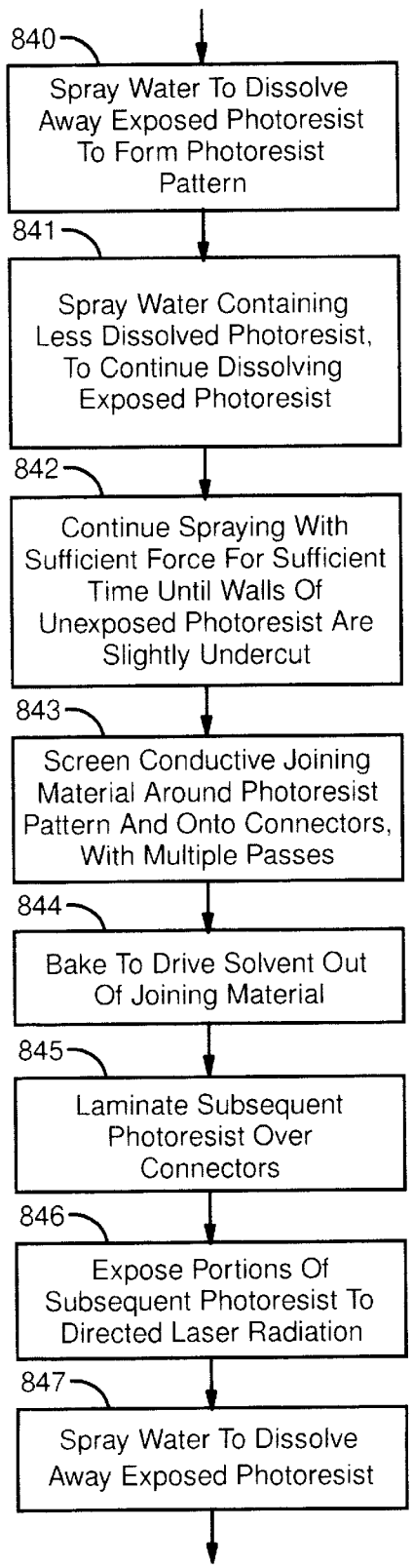
Figure 27D:
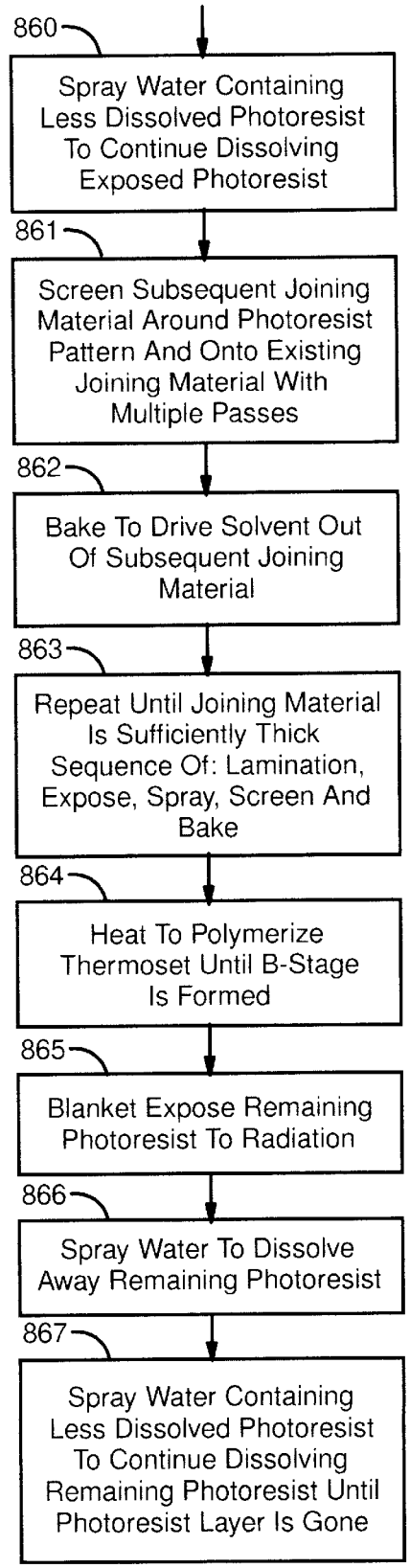

FIG. 26 is an enlargement of FIG. 25 that shows the chip (784) attached to the module (785) thru ECA bumps (786). The conductive path goes thru the chip circuit path then the via (787) then the ball circuit path (788) and finally the ball pad (789).

FIGS. 27a–d illustrate an embodiment with a process flow for making circuit cards with ECA terminals on two sides.

In step 800 fiberglass cloth is formed. In step 801 the cloth is dipped in a thermoset precursor. In step 802 it is cured to B-stage. In step 803 it is cut into prepregs. In step 804 holes are formed in a first copper foil. In step 805 holes are formed in a second copper foil. In step 806 prepreg is stacked between first and second copper foils and on other sides of foils. In step 807 the stack is laminated with heat and pressure. In step 808 photoresist is exposed to directed laser radiation. In step 809 a photoresist pattern is developed. In step 810 holes are formed through the stack. In step 811 holes and external surfaces are seeded. In step 820 holes and external surfaces are electrolessly plated with copper. In step 821 photoresist is stripped to form signal layers including connectors for connecting components. In step 822 solderresist is screened over signal layers with windows in solderresist containing connectors. In step 823 connectors are plated with Au. In step 824 flux is mixed into solvent. In step 825 a small amount of solvent is mixed with thermoset precursor if required. In step 826 Ag flakes are formed. In step 827 Ag flakes are mixed into precursor mixture until joining material is isotropically conductive. In step 828 photoresist is laminated over connectors. In step 829 portions of photoresist are exposed to directed laser radiation. In step 840 water is sprayed to dissolve away exposed photoresist to form photoresist pattern. In step 841 water containing less dissolved photoresist is sprayed to continue dissolving exposed photoresist. In step 842 spraying is continued with sufficient force for sufficient time until walls of unexposed photoresist are slightly undercut. In step 843 conductive joining material is screened around photoresist pattern and onto connectors, with multiple passes. In step 844 baking drives solvent out of the joining material. In step 845 subsequent photoresist is laminated over connectors. In step 846 portions of subsequent photoresist are exposed to directed laser radiation. In step 847 water is sprayed to dissolve away exposed photoresist. In step 860 water containing less dissolved photoresist is sprayed to continue dissolving exposed photoresist. In step 861 subsequent joining material is screened around photoresist pattern and onto existing joining material with multiple passes. In step 862 baking drives solvent out of subsequent joining material. In step 863 the sequence of: lamination, expose, spray, screen and bake is repeated until the joining material is sufficiently thick. In step 864 heat polymerizes thermoset until B-stage is formed. In step 865 the remaining photoresist is blanket exposes to radiation. In step 866 water is sprayed to dissolve away remaining photoresist. In step 867 water containing less dissolved photoresist is sprayed to continue dissolving remaining photoresist until the photoresist layer is removed.

Figure 28:
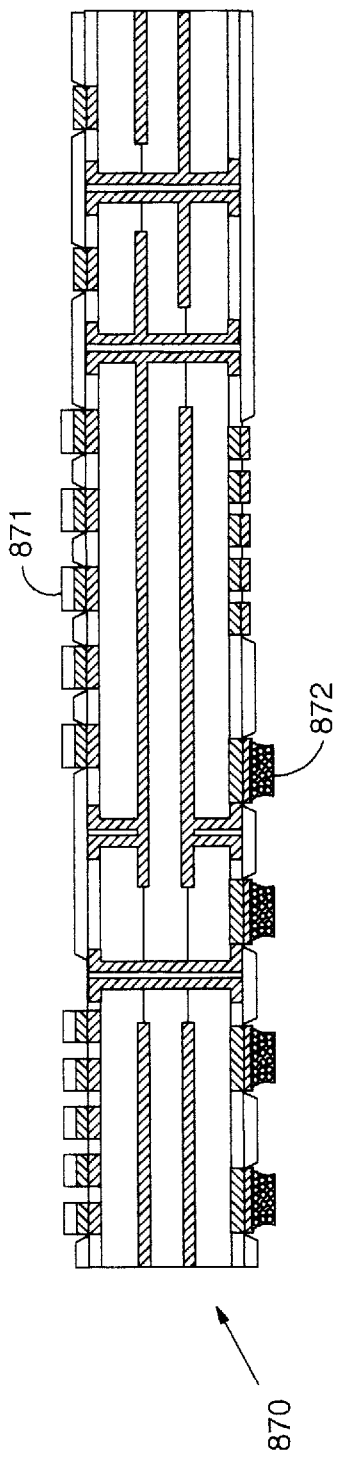
FIG. 28 is a cross section view of a card with ECA added on both sides.

FIG. 28 is a section view of a typical laminate card 870 where ECA has been added on the top 871 and the bottom 872 for preparation of SMT components.

Figure 29:
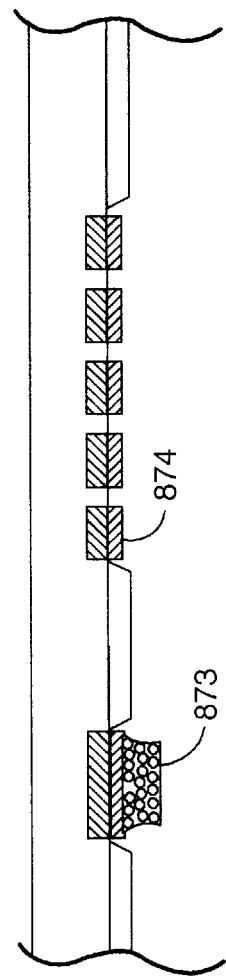
FIG. 29 is a partial, cross sectional enlargement of the central portion of FIG. 28.
Figure 30A:
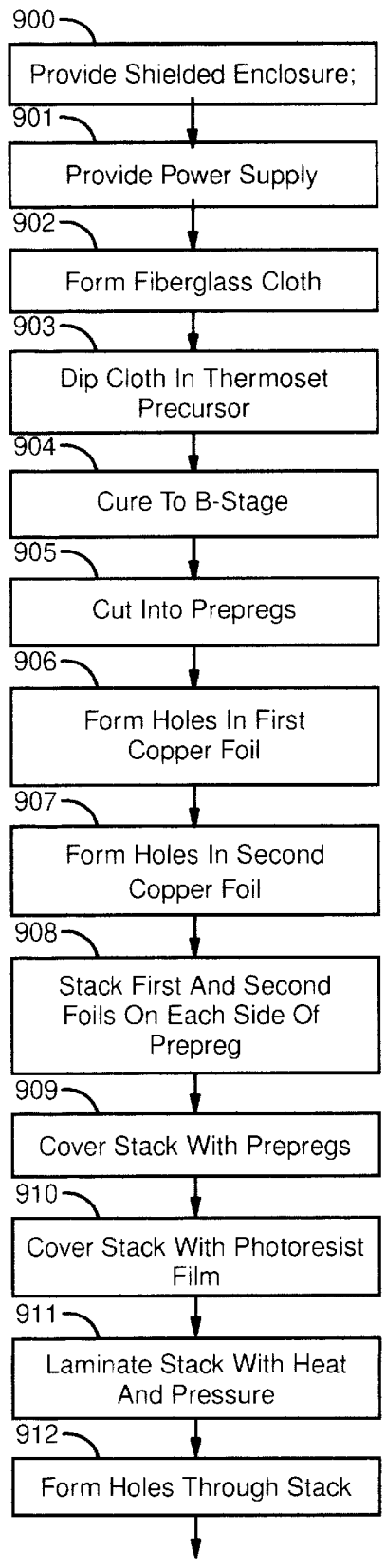
FIGS. 30a–30d is the process flow for manufacture of a computer having a card and bonding of SMT devices that have ECA added, to the card.
Figure 30B:
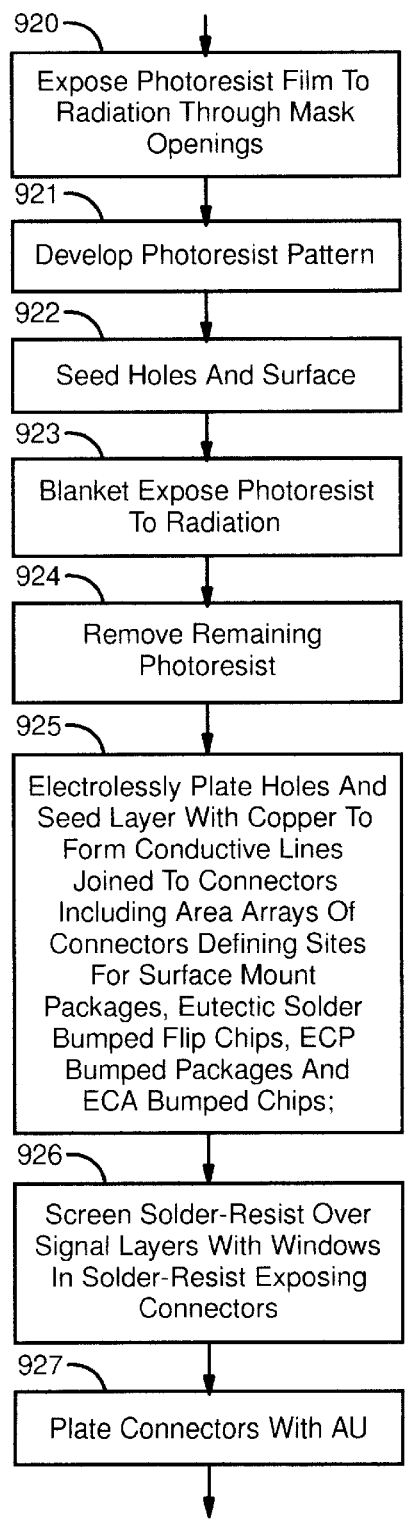
Figures 30C, 30D:
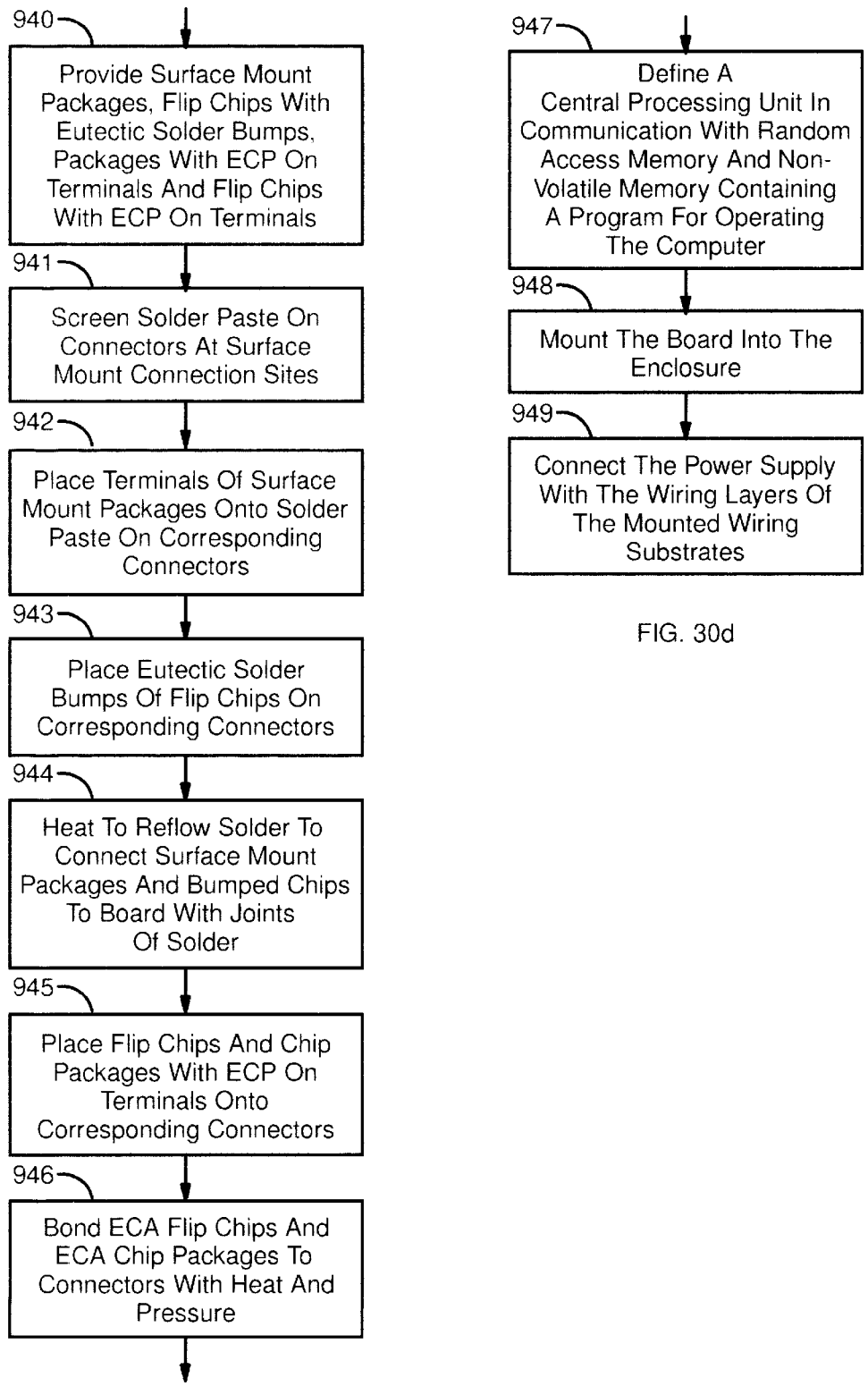

FIG. 29 is a partial enlarged view of FIG. 28, showing the ECA prepared SMT pads 873 and SMT pads without ECA material 874.

FIGS. 30*a–d* illustrate an embodiment with a process flow for making a circuit card and bonding devices to it, and then mounting it in a computer system.

In step 900 a shielded enclosure is provided. In step 901 a power supply is provided. In step 902 fiberglass cloth is formed. In step 903 cloth is dipped in thermoset precursor. In step 904 cloth is cured to b-stage. In step 905 cloth is cur into prepregs. In step 906 holes are formed in a first copper foil. In step 907 holes are formed in a second copper foil. In step 908 first and second foils are stacked on each side of prepreg. In step 909 the stack is covered with prepregs. In step 910 the stack is covered with photoresist film. In step 911 the stack is laminated with heat and pressure. In step 912 holes are formed through the stack. In step 920 photoresist film is exposed to radiation through mask openings. In step 921 the photoresist pattern is developed. In step 922 holes and surface are seeded. In step 923 photoresist is blanket exposed to radiation. In step 924 the remaining photoresist is removed. In step 925 holes and seed layer are electrolessly plated with copper to form conductive lines joined to connectors including area arrays of connectors defining sites for surface mount packages, eutectic solder bumped flip chips, ecp bumped packages and eca bumped chips. In step 926 solder-resist is screened over signal layers with windows in solder-resist exposing connectors. In step 927 connectors are plated with Au.

In step 940 surface mount packages, flip chips with eutectic solder bumps, packages with ecp on terminals, and flip chips with ecp on terminals are provided. In step 941 solder paste is screened on connectors at surface mount connection sites. In step 942 terminals of surface mount packages are placed onto solder paste on corresponding connectors. In step 943 eutectic solder bumps of flip chips are placed on corresponding connectors. In step 944 heat reflows solder to connect surface mount packages and bumped chips to board with joints of solder. In step 945 flip chips and chip packages with ecp on terminals are placed onto corresponding connectors. In step 946 eca flip chips and eca chip packages are bonded to connectors with heat and pressure. In step 947 connected components define a central processing unit (CPU) in communication with random access memory (RAM) and non-volatile read-only memory (ROM) containing a program for operating the computer. In step 948 the board is mounted into the enclosure. In step 949 the power supply is connected with the wiring layers of the mounted wiring substrates.

Figure 31:
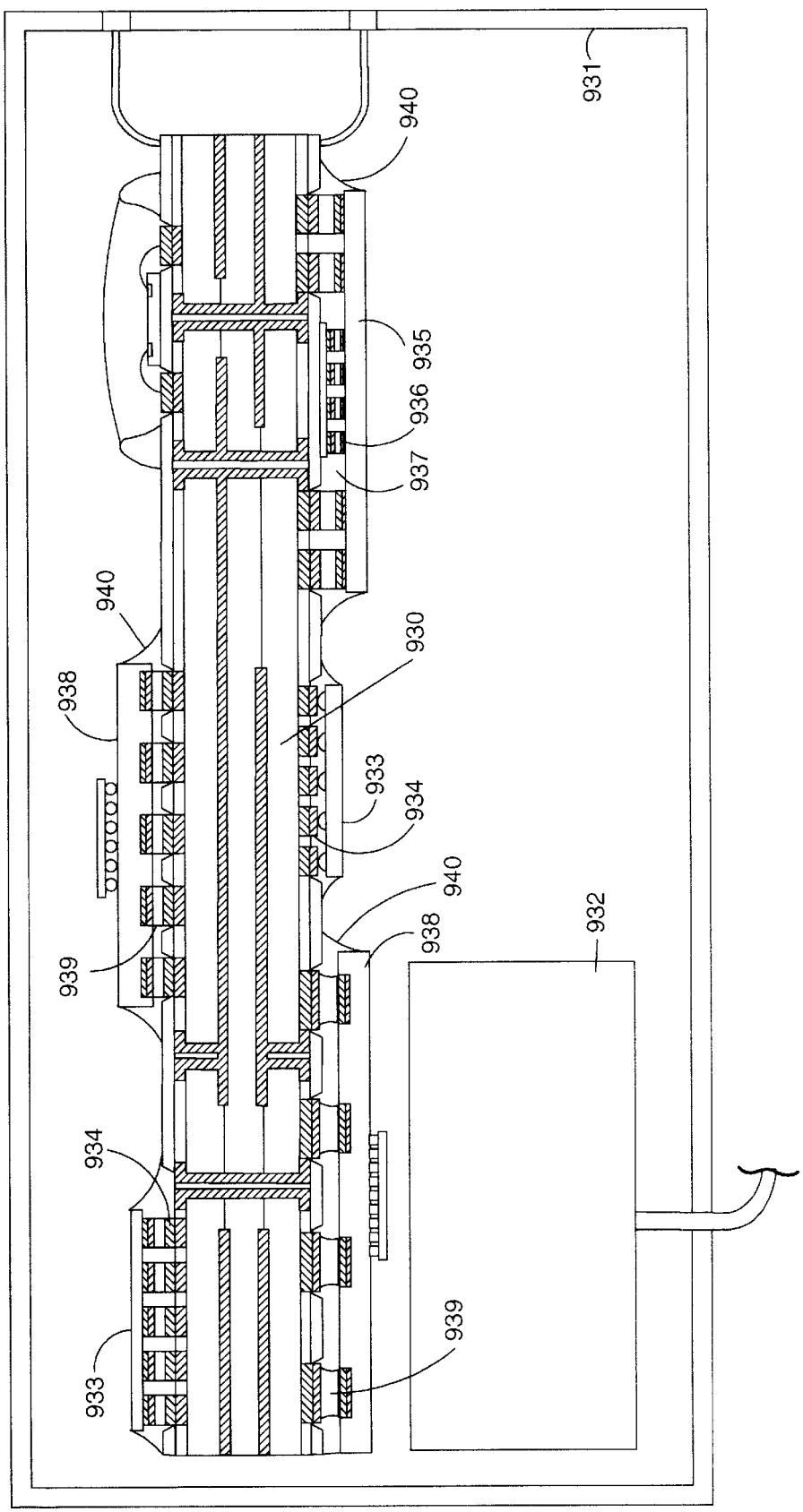
FIG. 31 is a cross section of a computer having a card with SMT devices bonded in place with ECA.

FIG. 31 illustrates a cross section of a multi-layer circuit card 930 inside a shielded enclosure 931, all powered by a power supply 932. The SMT devices ,shown are flip chips 933 connected with ECA directly to the card and encapsulated 934; flip chips on modules 935 connected with ECA 936 and encapsulated 937; and SMT modules 938 that are ECA connected 939 to the card and encapsulated 940.

Figure 32A:
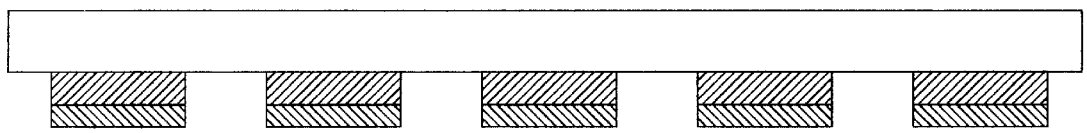
FIG. 32a shows a SMT module.
Figure 32B:
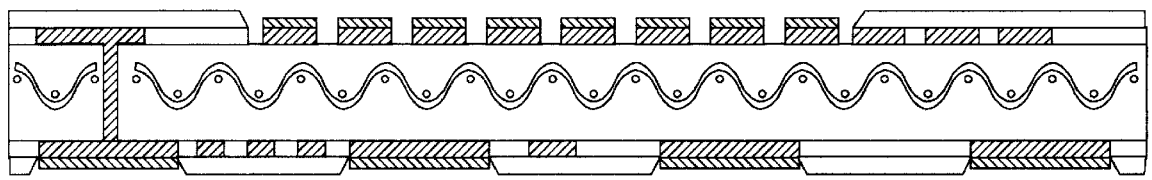
FIG. 32b is a cross section of a circuit card showing internal woven fiberglass cloth.
Figure 33A:
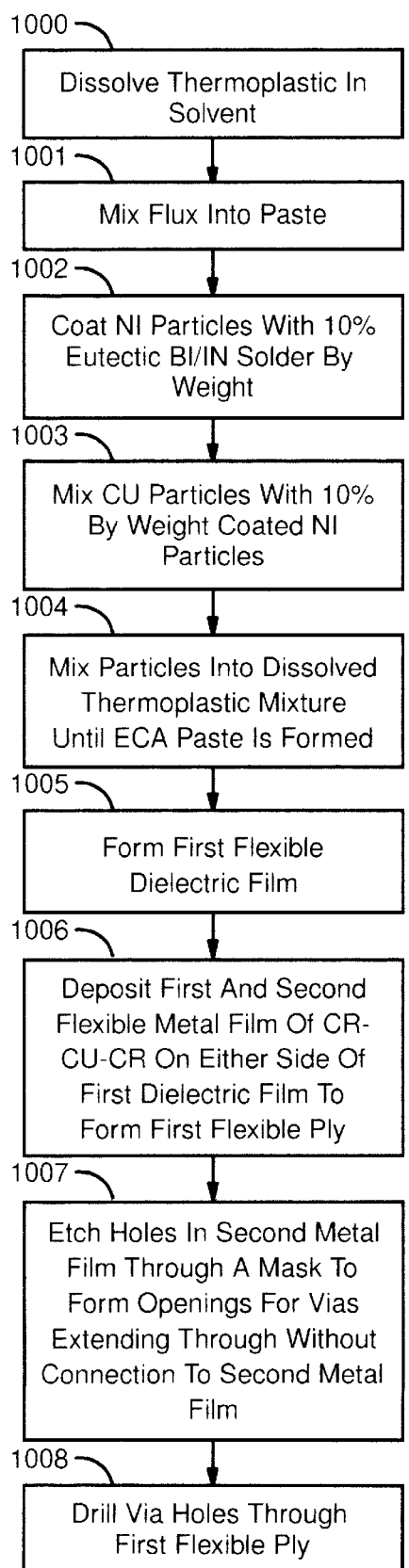
Figure 33B:
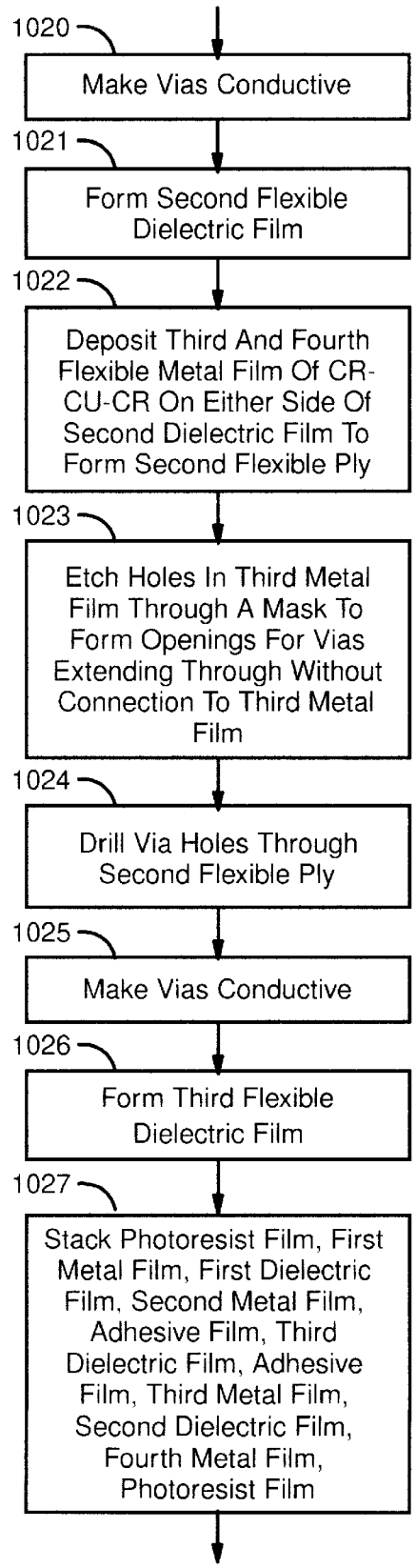
Figure 33E:
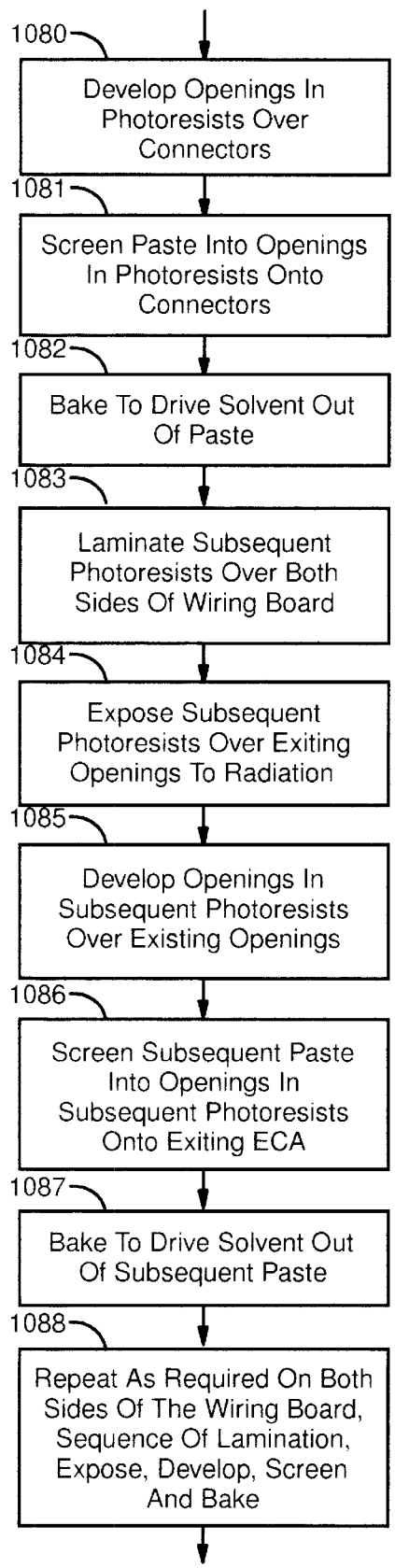
Figure 33F:
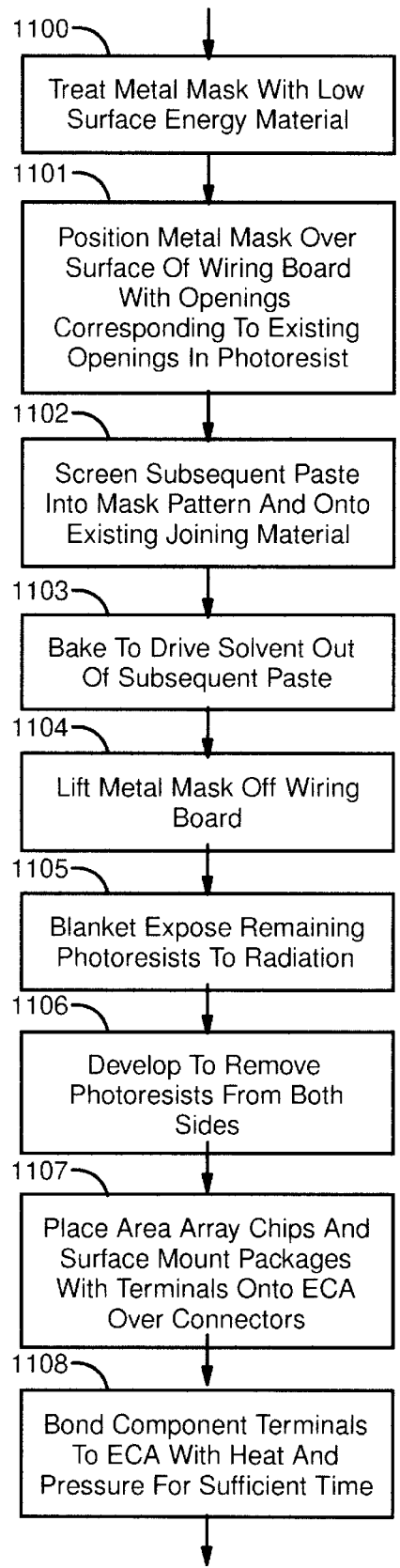

In FIG. 32*a* a surface mount module is shown, In FIG. 32*b* a cross section of a circuit card is shown with its internal woven fiberglass cloth.

FIGS. 33*a–h* shows yet another embodiment by means of a flow chart for a circuit card with soldered components and also ECA connected components.

In step 1000 thermoplastic is dissolved in solvent. In step 1001 flux is mixed into a paste. In step 1002 Ni particles are coated with 10% eutectic Bi/In solder by weight. In step 1003 Cu particles are mixed with 10% by weight coated Ni particles. In step 1004 the particles are mixed into dissolved thermoplastic mixture until eca paste is formed. In step 1005 a first flexible dielectric film is formed. In step 1006 first and second flexible metal films of Cr-Cu-Cr are deposited on either side of a first dielectric film to form a first flexible ply. In step 1007 holes are etched in second metal film through a mask to form openings for vias extending through without connection to second metal film. In step 1008 via holes are drilled through first flex ply. In step 1020 vias are made conductive. In step 1021 a second flexible dielectric film is formed. In step 1022 third and fourth flexible metal films of Cr-Cu-Cr are deposited on either side of second dielectric film to form second flexible ply. In step 1023 holes are etched in third metal film through a mask to form openings for vias extending through without connection to third metal film. In step 1024 via holes are drilled through second flexible ply. In step 1025 vias are made conductive. In step 1026 third flexible dielectric film is formed. In step 1027 photoresist film, first metal film, first dielectric film, second metal film, adhesive film, third dielectric film, adhesive film, third metal film, second dielectric film, fourth metal film, and photoresist film are stacked. In step 1040 the stack is laminated together with heat and pressure to form a flexible wiring board. In step 1041 photoresist is exposed to radiation through mask openings. In step 1042 a photoresist pattern is developed. In step 1043 third and fourth metal films are etched to form wiring layer including connectors defining eca connection sites for unbumped flip chips and surface mount components, solder paste connection sites for c4 bumped flip chips, unbumped flip chips, surface mount components, pin-in-hole components; and Au connection sites for wire bond chips, eutectic bumped flip chips, c4 bumped flip chips, eca bumped chips, eca bumped area array components. In step 1044 solder resist is laminated over external metal films. In step 1045 solder resist is exposed to radiation. In step 1046 openings are developed in solder resist over connectors. In step 1060 connectors are coated with Au. In step 1061 a screening mask with openings over connectors at solder paste connection sites, is placed onto wiring board surface. In step 1062 solder paste is screened into openings onto connections. In step 1063 heat reflows the solder paste. In step 1064 cooling solidifies the solder. In step 1065 the mask is removed from the surface. In step 1066 the sequence of place mask, screen solder paste, reflow, cool and remove is repeated as required on both sides of the wiring board. In step 1067 solder bumps are flattened. In step 1068 photoresist is laminated over both sides of wiring board. In step 1069 photoresist over connectors at selected component sites is exposed to radiation. In step 1080 openings in the photoresist over connectors is developed. In step 1081 paste is screened into openings in the photoresist onto connectors. In step 1082 baking drives solvent out of the paste. In step 1083 subsequent photoresist is laminated over both sides of wiring board. In step 1084 subsequent photoresist over exiting openings is exposed to radiation. In step 1085 openings in the subsequent photoresist over existing openings are developed. In step 1086 subsequent paste is screened into openings in subsequent photoresists onto exiting eca. In step 1087 baking drives solvent out of subsequent paste. In step 1088 the sequence of lamination, expose, develop, screen, and bake is repeated as required. In step 1100 a metal mask is treated with low surface energy material. In step 1101 the metal mask is positioned over the surface of wiring board with openings corresponding to existing openings in photoresist. In step 1102 subsequent paste is screened into mask pattern and onto existing joining material. In step 1103 baking drives solvent out of subsequent paste. In step 1104 the metal mask is lifted off the wiring board. In step 1105 the remaining photoresist is blanket exposed to radiation. In step 1106 the remaining photoresist is removed from both sides by developing. In step 1107 area array chips and surface mount packages with terminals are placed onto eca over connectors. In step 1108 component terminals are bonded to eca with heat and pressure for sufficient time. In step 1120 eca bumped flip chips and eca bumped area array components are placed onto connectors of a first side. In step 1121 eca bumps are bonded to connectors with heat and pressure for sufficient time. In step 1122 eca bumps on both sides of wiring board are encapsulated. In step 1123 solder paste is screened onto holes at connector sites for pin-in-hole (pih) components of first side of wiring board. In step 1124 adhesive is dispensed at the pih sites of first side. In step 1125 tacky flux is dispensed onto solder bumps on connectors of the first side. In step 1126 c4 bumped flip chips, unbumped flipichips, surface mount components are placed onto connectors with terminals on flux on solder bumps. In step 1127 eutectic bumped chips are placed onto connectors of first side. In step 1140 the wiring board is heated to reflow solder paste and solder bumps. In step 1141 the wiring board is cooled. In step 1142 solder connected flip chips are encapsulated. In step 1143 the board is flipped over onto the fixture and the steps after screening solder paste into holes are repeated, for second side of wiring board. In step 1144 wire bond chips are positioned at corresponding connection sites on second side of wiring board. In step 1145 connections between Au connectors and wire bond pads on chips are made with wire bonds. In step 1146 c4 bumped flip chips are positioned on corresponding connection sites on second side of wiring board. In step 1147 c4 bumps are bonded to Au coated connectors. In step 1148, the board is flipped over and the last 4 steps are repeated for first side of wiring board.

FIG. 34a is a cross section of a two sided SMT assembly. The multilayered laminate 1150 has soldered flip chips 1151 and ECA connected flip chips 1152. The modules shown are connected to the laminate with solder 1153 and ECA connections 1154. Also, standard SMT components 1155 are shown soldered to the card. Encapsulation material 1156 is shown on the flip chips and the SMT components.

FIG. 34b is a cross section of a two sided SMT and PIH assembly. The components shown are soldered flip chips 1157, ECA connected flip chips 1158, soldered 1159 and ECA connected modules 1160, PGA soldered modules 1161 and PIH soldered components 1162.

Figure 35A:
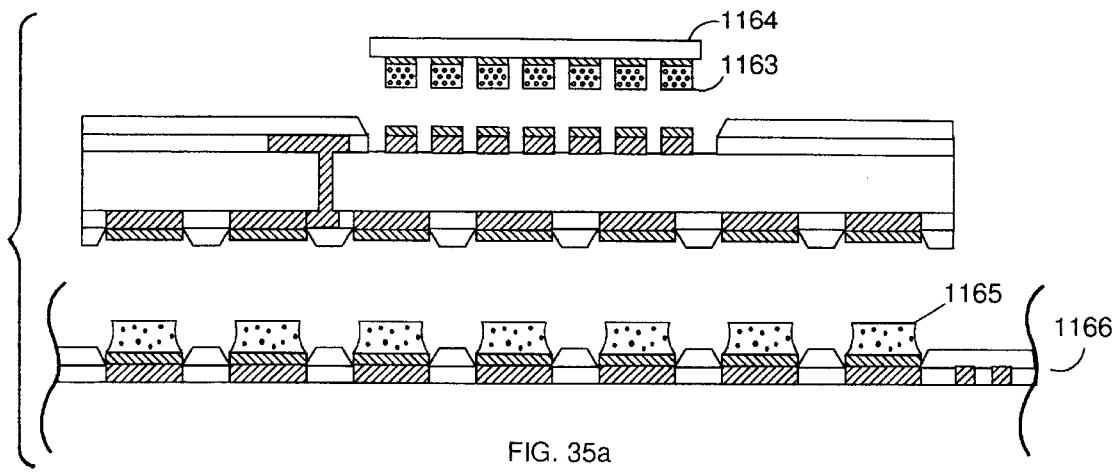
FIG. 35a is an exploded cross section that shows ECA on the chip and card but not the module.

FIG. 35a shows the first way to make a completed module assembly. ECA 1163 is added to the chip 1164 and ECA 1165 is added to the laminate card 1166 before bonding the assembly together.

Figure 35B:
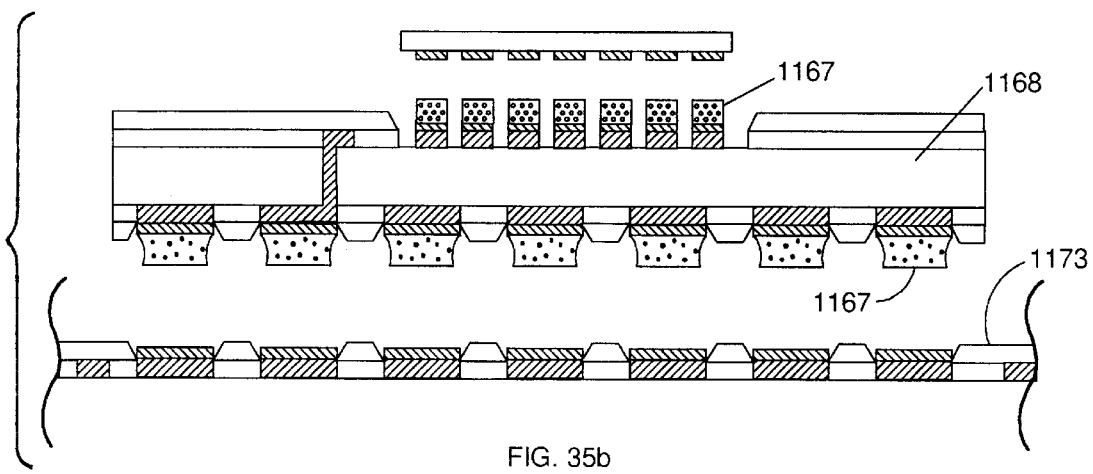
FIG. 35b is an exploded cross section of another way to add ECA to just the module.

FIG. 35b shows the second way to make a completed module assembly. ECA 1167 is added to both sides of the module 1168 prior to bonding the final assembly to the card 1173.

Figure 35C:
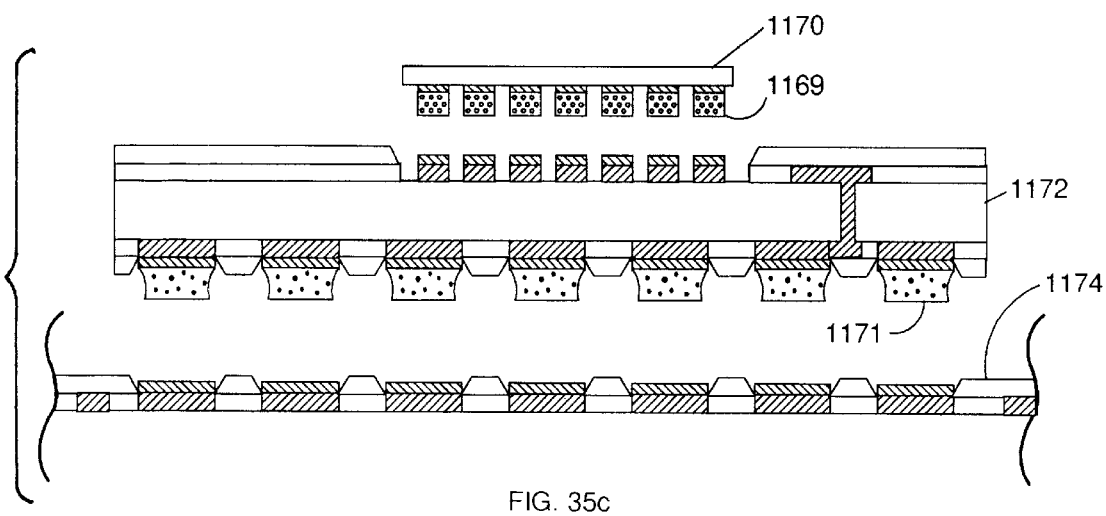
FIG. 35c is an exploded cross section of yet another way to add ECA to the chip and the module.
Figure 36E:
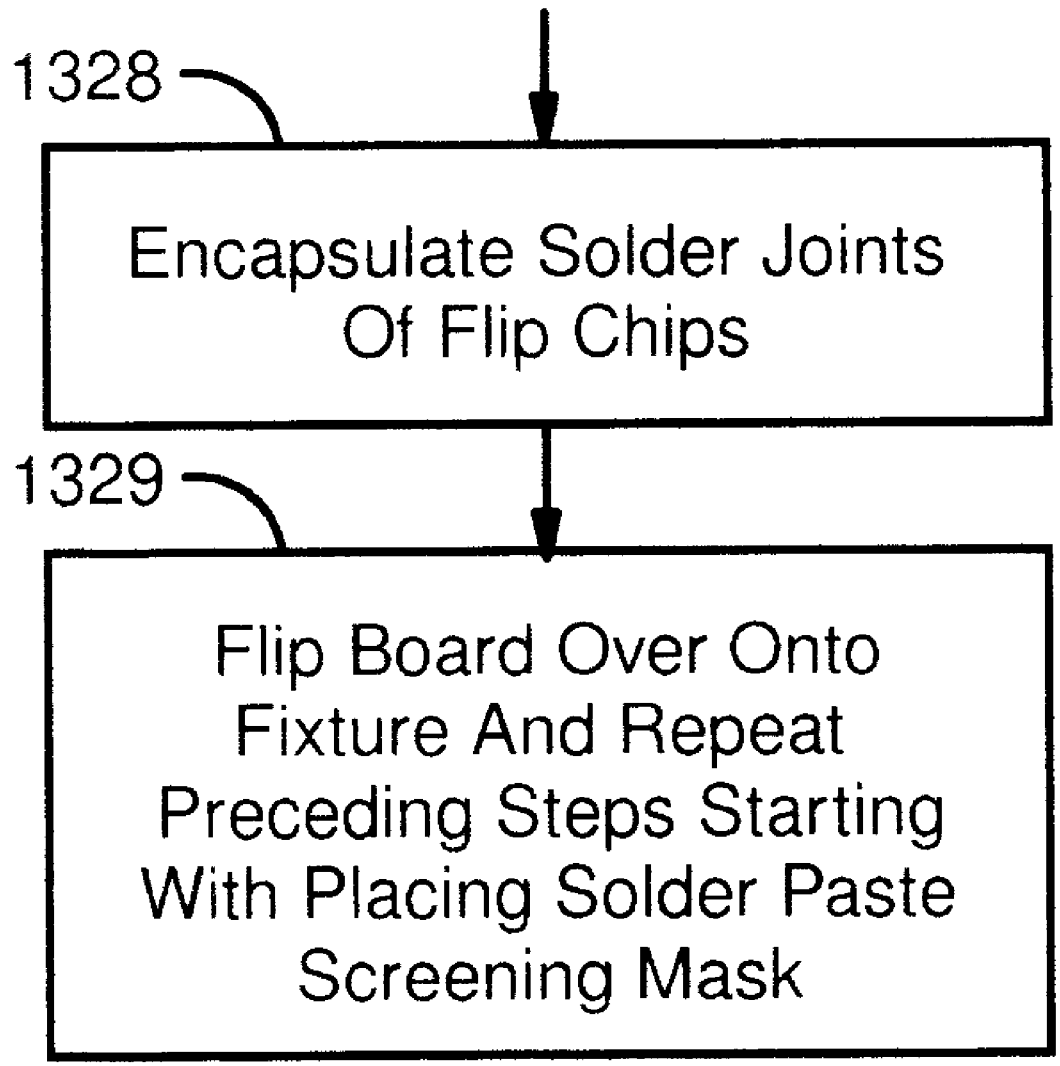

FIG. 35c shows the third way to make a completed module assembly. ECA 1169 is added to the chip 1170 and ECA 1171 is added to the module 1172 prior to bonding the assembly together to the card 1174.

FIGS. 36a–e illustrate the process flow for placing ECA chips on a module.

In step 1250 pbga, tbga, and leaded surface mount components are prepared, with flip chips connected by eca. In step 1251 photoimagable dielectric film is selectively exposed to radiation. In step 1252 unexposed dielectric film is developed away to form via holes. In step 1253 via holes and exposed dielectric surface are seeded. In step 1254 photoresist is laminated to both sides of board. In step 1255 photoresist is selectively exposed to radiation. In step 1256 portions of the photoresist are developed away. In step 1257 copper is electrolessly plated into vias and onto exposed seeded surface. In step 1258 photoresist is stripped off both sides. In step 1259 exposed seeding layer is etched away. In step 1270 photoimagable dielectric film is laminated to both sides of the board. In step 1271 dielectric films are selectively exposed to radiation. In step 1272 unexposed dielectric film is developed away to form via holes. In step 1273 via holes and exposed dielectric surfaces are seeded. In step 1274 photoresist is laminated to both sides of the board. In step 1275 photoresist is selectively exposed to radiation. In step 1276 portions of the photoresist are developed away. In step 1277 via holes and dielectric surfaces are electrolessly plated to form external wiring layers including connectors defining solder paste connection sites for c4 bumped flip chips, unbumped flip chips, leaded surface mount components, and ball grid array modules. In step 1290 photoresist is stripped off both sides. In step 1291 exposed seeding layer is etched away. In step 1292 solder resist is laminated over both sides of the wiring board. In step 1293 solder resist is selectively exposed to radiation. In step 1294 openings in solder resist over connectors are developed. In step 1295 a screening mask with openings over connectors at solder paste connection sites is placed, onto the wiring board surface. In step 1296 molten solder is injected into the openings onto the connections. In step 1297 cooling solidifies the solder. In step 1298 the mask is removed from surface. In step 1299 solder bumps are flattened. In step 1300 the steps of placing mask, screening, cooling, removing, flattening are repeated on the other side of wiring board. In step 1320 a solder paste screening mask with openings over connectors requiring additional solder is placed, onto the wiring board surface. In step 1321 solder paste is screened into openings onto connections. In step 1322 the mask is removed from the surface. In step 1323 tacky flux is dispensed onto solder bumps on connectors of the first side. In step 1324 c4 chips, unbumped flip chips, and surface mount components are placed onto corresponding connectors with terminals on solder bumps or solder paste. In step 1325 eutectic bumped chips are placed onto connectors of the first side. In step 1326 the wiring board is heated to reflow solder paste and solder bumps. In step 1327 the wiring board is cooled. In step 1328 solder joints of flip chips are encapsulated. In step 1329 the board is flipped over onto the fixture and the preceding steps are repeated starting with placing solder paste screening mask.

Figure 37:
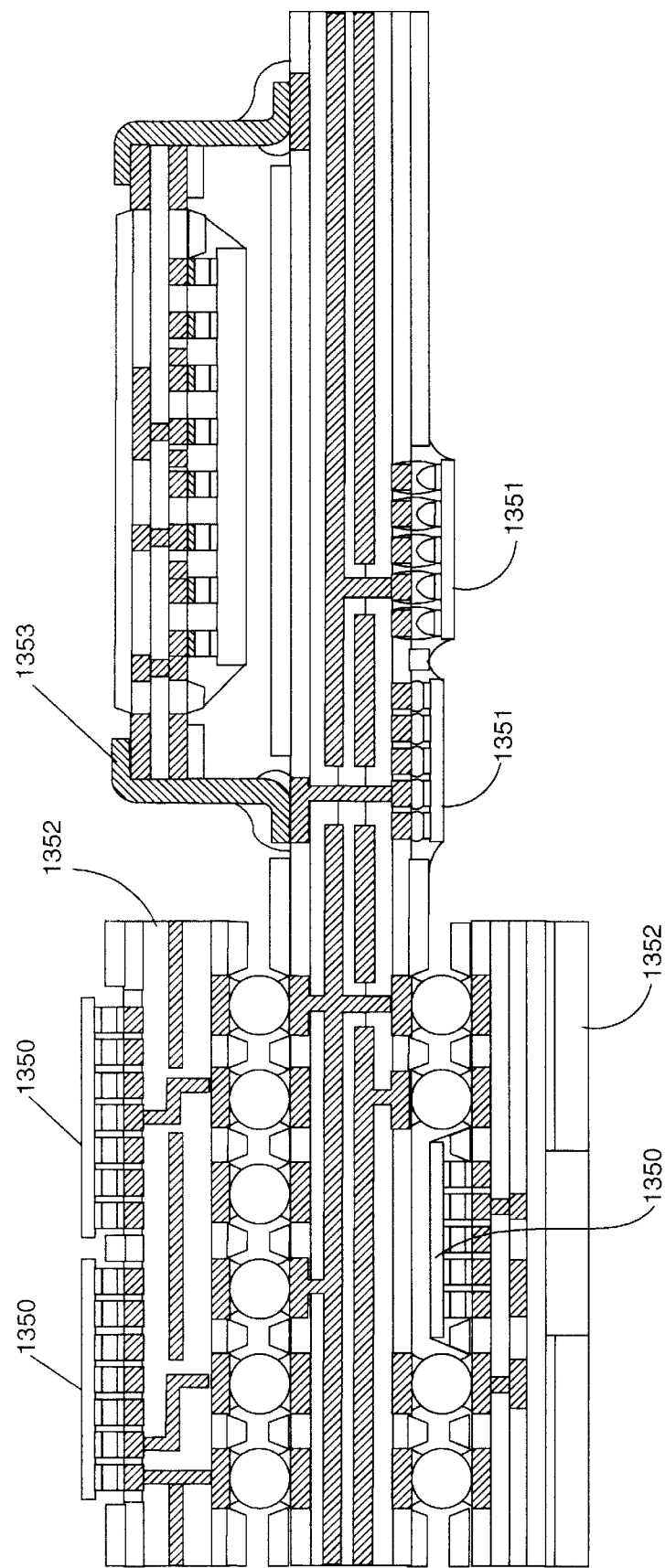
FIG. 37 is a cross section of a SMT soldered card with modules that have ECA connected chips.

FIG. 37 illustrates a cross section that shows a double sided SMT processed assembly that consists of flip chips joined with ECA 1350 and soldered 1351, soldered BGA modules 1352 and gull winged leaded 1353 SMT components.

While there have been shown and described what are at present considered the preferred embodiments of the invention, it will be obvious to those skilled in the art that various changes and modifications may be made therein without departing from the scope of the invention as defined by the appended claims.

What is claimed is:

1. A component carrier having raised bonding sites of connected joining material, comprising:

a substrate having one or more electrically conductive wiring layers, said layers having conductive lines terminating in connecting pad areas;

a first layer of cured electrically conductive adhesive material positioned over at least part of at least one of said connecting pad areas, providing electrical connection to said connecting pad areas; and a second layer of uncured electrically conductive adhesive material positioned over at least parts of said first layer of cured electrically conductive adhesive material, forming a connected joining material structure, thereby providing raised bonding sites on said component carrier.

2. The component carrier of claim 1 in which at least one of said layers of adhesive material is a thermoplastic or thermoset electrically conductive adhesive.

3. The component carrier of claim 1 in which said substrate is a flexible dielectric film.

4. The component carrier of claim 1 further comprising one or more components having electrically conducting terminals, said terminals connected electrically to said raised bonding sites.

5. An integrated circuit, comprising:

a semiconductor chip having a plurality of electrically conductive terminals on a first surface thereof:

a first layer of cured electrically conductive adhesive material positioned over at least part of at least one of said electrically conductive terminals, providing electrical connection to said electrically conductive terminals; and a second layer of uncured electrically conductive adhesive material positioned over at least parts of said first layer of cured electrically conductive adhesive material, forming a connected joining material structure, thereby providing raised bonding sites on said integrated circuit.

6. The integrated circuit of claim 5 in which said adhesive material is a thermoplastic or thermoset electrically conductive adhesive.

* * * * *